United States Patent
Yuan et al.

(10) Patent No.: US 12,040,029 B2
(45) Date of Patent: Jul. 16, 2024

(54) SHIFT REGISTER AND METHOD OF DRIVING THE SAME, SCAN DRIVING CIRCUIT AND DISPLAY APPARATUS

(71) Applicants: Hefei BOE Joint Technology Co., Ltd., Anhui (CN); BOE TECHNOLOGY GROUP CO., LTD., Beijing (CN)

(72) Inventors: Can Yuan, Beijing (CN); Yongqian Li, Beijing (CN); Zhidong Yuan, Beijing (CN)

(73) Assignees: HEFEI BOE JOINT TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/776,306

(22) PCT Filed: May 26, 2021

(86) PCT No.: PCT/CN2021/095923
§ 371 (c)(1),
(2) Date: May 12, 2022

(87) PCT Pub. No.: WO2022/246673
PCT Pub. Date: Dec. 1, 2022

(65) Prior Publication Data
US 2024/0153571 A1    May 9, 2024

(51) Int. Cl.
G09G 3/3225    (2016.01)
G11C 19/28    (2006.01)

(52) U.S. Cl.
CPC ........... *G11C 19/28* (2013.01); *G09G 3/3225* (2013.01); *G09G 2300/0842* (2013.01); *G09G 2310/0286* (2013.01); *G09G 2310/08* (2013.01)

(58) Field of Classification Search
None
See application file for complete search history.

(56) References Cited

U.S. PATENT DOCUMENTS

| | | | |
|---|---|---|---|
| 2015/0287392 A1* | 10/2015 | Kim | G09G 3/3677 327/109 |
| 2016/0274713 A1* | 9/2016 | Zhang | G06F 3/0412 |
| 2018/0082652 A1* | 3/2018 | Lv | G09G 3/3677 |
| 2018/0268914 A1* | 9/2018 | Zhao | G11C 19/28 |
| 2021/0335178 A1* | 10/2021 | Hu | G11C 19/28 |

* cited by examiner

*Primary Examiner* — Sepehr Azari
(74) *Attorney, Agent, or Firm* — IP & T GROUP LLP

(57) ABSTRACT

A shift register includes: an input circuit electrically connected to a first clock signal terminal, a first voltage signal terminal and a first node; a first output circuit electrically connected to the first node, a second clock signal terminal and a scanning signal terminal; a first control circuit electrically connected to a third clock signal terminal, a fourth clock signal terminal, a fifth clock signal terminal and the first node; a second control circuit electrically connected to a sixth clock signal terminal, a second voltage signal terminal, the first node, the first voltage signal terminal and a second node; a third control circuit electrically connected to the first node, the second voltage signal terminal, the third clock signal terminal and the second node; and a second output circuit electrically connected to the second node, the second voltage signal terminal and the scanning signal terminal.

20 Claims, 14 Drawing Sheets

SHIFT REGISTER AND METHOD OF DRIVING THE SAME, SCAN DRIVING CIRCUIT AND DISPLAY APPARATUS

CROSS-REFERENCE TO RELATED APPLICATION

This application is a national phase entry under 35 USC 371 of International Patent Application No. PCT/CN2021/095923, filed on May 26, 2021, which is incorporated herein by reference in its entirety.

TECHNICAL FIELD

The present disclosure relates to the field of display technologies, and in particular, to a shift register and a method of driving the same, a scan driving circuit, and a display apparatus.

BACKGROUND

A scan driving circuit is an important component in a display apparatus. The scan driving circuit may includes a plurality of shift registers that are connected in cascade, and the plurality of shift registers may be electrically connected to a plurality of wires in the display apparatus. The scan driving circuit may input scanning signals row by row to the plurality of wires (e.g., gate lines or enable signal lines) in the display apparatus, so that the display apparatus may display images.

By providing the scan driving circuit in the display apparatus, costs may be effectively reduced and the yield may be improved.

SUMMARY

In an aspect, a shift register is provided. The shift register includes an input circuit, a first output circuit, a first control circuit, a second control circuit, a third control circuit and a second output circuit. The input circuit is electrically connected to a first clock signal terminal, a first voltage signal terminal and a first node. The input circuit is configured to transmit a first voltage signal received at the first voltage signal terminal to the first node under control of a first clock signal transmitted by the first clock signal terminal. The first output circuit is electrically connected to the first node, a second clock signal terminal and a scanning signal terminal. The first output circuit is configured to transmit a second clock signal received at the second clock signal terminal to the scanning signal terminal under control of a voltage of the first node, so as to cause the scanning signal terminal to output a scanning signal. The first control circuit is electrically connected to a third clock signal terminal, a fourth clock signal terminal, a fifth clock signal terminal and the first node. The first control circuit is configured to transmit a fifth clock signal received at the fifth clock signal terminal to the first node under control of both a third clock signal transmitted by the third clock signal terminal and a fourth clock signal transmitted by the fourth clock signal terminal, so as to control the voltage of the first node. The second control circuit is electrically connected to a sixth clock signal terminal, a second voltage signal terminal, the first node, the first voltage signal terminal and a second node. The second control circuit is configured to, under control of a sixth clock signal transmitted by the sixth clock signal terminal, transmit a second voltage signal received at the second voltage signal terminal to the first node to control the voltage of the first node and transmit the first voltage signal to the second node to control a voltage of the second node. The third control circuit is electrically connected to the first node, the second voltage signal terminal, the third clock signal terminal and the second node. The third control circuit is configured to control the voltage of the second node under cooperation of the voltage of the first node and the third clock signal. The second output circuit is electrically connected to the second node, the second voltage signal terminal and the scanning signal terminal. The second output circuit is configured to transmit the second voltage signal to the scanning signal terminal under control of the voltage of the second node, so as to cause the scanning signal terminal to output the scanning signal.

In some embodiments, the input circuit includes a first transistor. A control electrode of the first transistor is electrically connected to the first clock signal terminal, a first electrode of the first transistor is electrically connected to the first voltage signal terminal, and a second electrode of the first transistor is electrically connected to the first node.

In some embodiments, the first output circuit includes a second transistor and a first capacitor. A control electrode of the second transistor is electrically connected to the first node, a first electrode of the second transistor is electrically connected to the second clock signal terminal, and a second electrode of the second transistor is electrically connected to the scanning signal terminal. A first end of the first capacitor is electrically connected to the first node, and a second end of the first capacitor is electrically connected to the scanning signal terminal.

In some embodiments, the first control circuit includes a third transistor and a fourth transistor. A control electrode of the third transistor is electrically connected to the third clock signal terminal, a first electrode of the third transistor is electrically connected to the fifth clock signal terminal, and a second electrode of the third transistor is electrically connected to a first electrode of the fourth transistor. A control electrode of the fourth transistor is electrically connected to the fourth clock signal terminal, and a second electrode of the fourth transistor is electrically connected to the first node.

In some embodiments, the second control circuit includes a fifth transistor and a sixth transistor. A control electrode of the fifth transistor is electrically connected to the sixth clock signal terminal, a first electrode of the fifth transistor is electrically connected to the second voltage signal terminal, and a second electrode of the fifth transistor is electrically connected to the first node. A control electrode of the sixth transistor is electrically connected to the sixth clock signal terminal, a first electrode of the sixth transistor is electrically connected to the first voltage signal terminal, and a second electrode of the sixth transistor is electrically connected to the second node.

In some embodiments, the third control circuit includes a seventh transistor and an eighth transistor. A control electrode of the seventh transistor is electrically connected to the first node, a first electrode of the seventh transistor is electrically connected to the second voltage signal terminal, and a second electrode of the seventh transistor is electrically connected to the second node. A control electrode of the eighth transistor is electrically connected to the third clock signal terminal, a first electrode of the eighth transistor is electrically connected to the third clock signal terminal, and a second electrode of the eighth transistor is electrically connected to the second node. A width-to-length ratio of the seventh transistor is greater than a width-to-length ratio of the eighth transistor.

In some embodiments, the second output circuit includes a ninth transistor. A control electrode of the ninth transistor is electrically connected to the second node, a first electrode of the ninth transistor is electrically connected to the second voltage signal terminal, and a second electrode of the ninth transistor is electrically connected to the scanning signal terminal.

In some embodiments, the third control circuit is further electrically connected to a seventh clock signal terminal. The third control circuit is further configured to control the voltage of second node under cooperation of a seventh clock signal transmitted by the seventh clock signal terminal, the voltage of the first node and the third clock signal. The seventh clock signal and the third clock signal are inverted signals.

In some embodiments, the third control circuit further includes a tenth transistor. A control electrode of the tenth transistor is electrically connected to the seventh clock signal terminal, a first electrode of the tenth transistor is electrically connected to the seventh clock signal terminal, and a second electrode of the tenth transistor is electrically connected to the second node. In a case where the third control circuit includes the seventh transistor, the width-to-length ratio of the seventh transistor is greater than a width-to-length ratio of the tenth transistor.

In some embodiments, the shift register further includes a fourth control circuit. The fourth control circuit is electrically connected to the second node, the second voltage signal terminal and the first node; the fourth control circuit is configured to transmit the second voltage signal to the first node under the control of the voltage of the second node.

In some embodiments, the fourth control circuit includes an eleventh transistor. A control electrode of the eleventh transistor is electrically connected to the second node, a first electrode of the eleventh transistor is electrically connected to the second voltage signal terminal, and a second electrode of the eleventh transistor is electrically connected to the first node.

In some embodiments, the shift register further includes a first potential pull-up circuit. The first potential pull-up circuit is electrically connected to the scanning signal terminal and a third node. The first output circuit is further electrically connected to the third node. The first potential pull-up circuit is configured to pull up the voltage of the first node with the scanning signal in a phase in which the first output circuit causes the scanning signal terminal to output the scanning signal.

In some embodiments, the first potential pull-up circuit includes a second capacitor. A first end of the second capacitor is electrically connected to the scanning signal terminal, and a second end of the second capacitor is electrically connected to the third node. In a case where the first output circuit includes the first capacitor, the second end of the first capacitor is electrically connected to the scanning signal terminal through the second capacitor.

In some embodiments, the shift register further includes a second potential pull-up circuit. The second potential pull-up circuit is electrically connected to the first node, the fourth clock signal terminal, a seventh clock signal terminal and the third node; and the second potential pull-up circuit is configured to transmit a seventh clock signal received at the seventh clock signal terminal to the third node under control of both the voltage of the first node and the fourth clock signal, so as to pull up the voltage of the first node with the seventh clock signal.

In some embodiments, the second potential pull-up circuit includes a twelfth transistor and a thirteenth transistor. A control electrode of the twelfth transistor is electrically connected to the first node, a first electrode of the twelfth transistor is electrically connected to the seventh clock signal terminal, and a second electrode of the twelfth transistor is electrically connected to a first electrode of the thirteenth transistor. A control electrode of the thirteenth transistor is electrically connected to the fourth clock signal terminal, and a second electrode of the thirteenth transistor is electrically connected to the third node.

In some embodiments, the shift register further includes an anti-leakage circuit. The anti-leakage circuit is electrically connected to the first node, the first voltage signal terminal and an anti-leakage node; the anti-leakage circuit is configured to transmit the first voltage signal to the anti-leakage node under the control of the voltage of the first node. The second control circuit is further electrically connected to the anti-leakage node. In a case where the shift register further includes the fourth control circuit, the fourth control circuit is further electrically connected to the anti-leakage node.

In some embodiments, the anti-leakage circuit includes a fourteenth transistor. A control electrode of the fourteenth transistor is electrically connected to the first node, a first electrode of the fourteenth transistor is electrically connected to the first voltage signal terminal, and a second electrode of the fourteenth transistor is electrically connected to the anti-leakage node. In a case where the second control circuit includes the fifth transistor, the fifth transistor includes a first sub-transistor and a second sub-transistor. A control electrode of the first sub-transistor is electrically connected to the sixth clock signal terminal, a first electrode of the first sub-transistor is electrically connected to the second voltage signal terminal, and a second electrode of the first sub-transistor is electrically connected to the anti-leakage node. A control electrode of the second sub-transistor is electrically connected to the sixth clock signal terminal, a first electrode of the second sub-transistor is electrically connected to the anti-leakage node, and a second electrode of the second sub-transistor is electrically connected to the first node. In a case where the fourth control circuit includes the eleventh transistor, the eleventh transistor includes a third sub-transistor and a fourth sub-transistor. A control electrode of the third sub-transistor is electrically connected to the second node, a first electrode of the third sub-transistor is electrically connected to the second voltage signal terminal, and a second electrode of the third sub-transistor is electrically connected to the anti-leakage node. A control electrode of the fourth sub-transistor is electrically connected to the second node, a first electrode of the fourth sub-transistor is electrically connected to the anti-leakage node, and a second electrode of the fourth sub-transistor is electrically connected to the first node.

In another aspect, a method of driving the shift register as described in any of the above embodiments is provided. The method includes: in a first phase, in response to the first clock signal received at the first clock signal terminal, the input circuit being turned on, and transmitting the first voltage signal received at the first voltage signal terminal to the first node; under the control of the voltage of the first node, the first output circuit being turned on, and transmitting the second clock signal received at the second clock signal terminal to the scanning signal terminal, so as to cause the scanning signal terminal to output the scanning signal; transmitting, by the third control circuit, the second voltage signal received at the second voltage signal terminal to the second node to control the voltage of the second node, under the control of the voltage of the first node; and under the control of the voltage of the second node, the second output circuit being turned off; in a second phase, in response to the sixth clock signal received at the sixth clock signal terminal, the second control circuit being turned on, transmitting the second voltage signal to the first node to control the voltage of the first node, and transmitting the first voltage signal to the second node to control the voltage of the second node; under the control of the voltage of the first node, the first output circuit being turned off; and under the control of the voltage of the second node, the second output circuit being turned on, and transmitting the second voltage signal to the scanning signal terminal, so as to cause the scanning signal terminal to output the scanning signal; in a third phase, transmitting, by the first control circuit, the fifth clock signal received at the fifth clock signal terminal to the first node to control the voltage of the first node, in response to the third clock signal received at the third clock signal terminal and the fourth clock signal received at the fourth clock signal terminal; under the control of the voltage of the first node, the first output circuit being turned on, and transmitting the second clock signal to the scanning signal terminal, so as to causes the scanning signal terminal to output the scanning signal; transmitting, by the third control circuit, the second voltage signal to the second node to control the voltage of the second node, under the control of the voltage of the first node; and under the control of the voltage of the second node, the second output circuit being turned off; in a fourth phase, transmitting, by the first control circuit, the fifth clock signal to the first node to control the voltage of the first node, in response to the third clock signal and the fourth clock signal; under the control of the voltage of the first node, the first output circuit being turned off; transmitting, by the third control circuit, the third clock signal to the second node to control the voltage of the second node, in response to the third clock signal; and under the control of the voltage of the second node, the second output circuit being turned on, and transmitting the second voltage signal to the scanning signal terminal, so as to cause the scanning signal terminal to output the scanning signal.

In yet another aspect, a scan driving circuit is provided. The scan driving circuit includes a plurality of shift registers that are connected in cascade as described in any of the above embodiments.

In yet another aspect, a display apparatus is provided. The display apparatus includes the scan driving circuit as described in any of the above embodiments.

BRIEF DESCRIPTION OF THE DRAWINGS

In order to describe technical solutions in the present disclosure more clearly, accompanying drawings to be used in some embodiments of the present disclosure will be introduced briefly below. Obviously, the accompanying drawings to be described below are merely accompanying drawings of some embodiments of the present disclosure, and a person of ordinary skill in the art can obtain other drawings according to these drawings. In addition, the accompanying drawings in the following description may be regarded as schematic diagrams, and are not limitations on actual sizes of products, actual processes of methods and actual timings of signals involved in the embodiments of the present disclosure.

DETAILED DESCRIPTION

Figure 1:
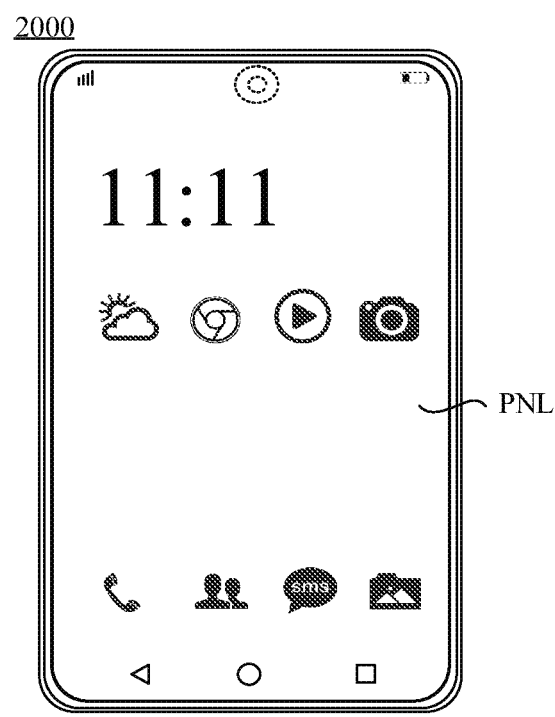
FIG. 1 is a structural diagram of a display apparatus, in accordance with some embodiments of the present disclosure.

Technical solutions in some embodiments of the present disclosure will be described clearly and completely with reference to the accompanying drawings below. Obviously, the described embodiments are merely some but not all embodiments of the present disclosure. All other embodiments obtained by a person of ordinary skill in the art based on the embodiments of the present disclosure shall be included in the protection scope of the present disclosure.

Unless the context requires otherwise, throughout the description and the claims, the term "comprise" and other forms thereof such as the third-person singular form "comprises" and the present participle form "comprising" are construed as open and inclusive, i.e., "including, but not limited to". In the description of the specification, the terms such as "one embodiment", "some embodiments", "exemplary embodiments", "example", "specific example" or "some examples" is intended to indicate that specific features, structures, material, or characteristics related to the embodiment(s) or example(s) are included in at least one embodiment or example of the present disclosure. Schematic representations of the above terms do not necessarily refer to the same embodiment(s) or example(s). In addition, the specific features, structures, materials or characteristics may be included in any one or more embodiments or examples in any suitable manner.

Hereinafter, the terms such as "first" and "second" are used for descriptive purposes only, and are not to be construed as indicating or implying the relative importance or implicitly indicating the number of indicated technical features. Thus, a feature defined with "first" or "second" may explicitly or implicitly include one or more of the features. In the description of the embodiments of the present disclosure, "a plurality of" or "the plurality of" means two or more unless otherwise specified.

In the description of some embodiments, the term "connected" and derivatives thereof may be used. For example, the term "connected" may be used in the description of some embodiments to indicate that two or more components are in direct physical or electrical contact with each other. The embodiments disclosed herein are not necessarily limited to the content herein.

The phrase "at least one of A, B and C" has the same meaning as the phrase "at least one of A, B or C", and they both include the following combinations of A, B and C: only A, only B, only C, a combination of A and B, a combination of A and C, a combination of B and C, and a combination of A, B and C.

The phrase "A and/or B" includes the following three combinations: only A, only B, and a combination of A and B.

As used herein, the term "if" is optionally construed as "when" or "in a case where" or "in response to determining" or "in response to detecting", depending on the context. Similarly, the phrase "if it is determined" or "if [a stated condition or event] is detected" is optionally construed as "in a case where it is determined" or "in response to determining" or "in a case where [the stated condition or event] is detected" or "in response to detecting [the stated condition or event]", depending on the context.

The phrase "applicable to" or "configured to" as used herein means an open and inclusive expression, which does not exclude devices that are applicable to or configured to perform additional tasks or steps.

In addition, the use of the phase "based on" is meant to be open and inclusive, since a process, step, calculation or other action that is "based on" one or more of the stated conditions or values may, in practice, be based on additional conditions or value beyond those stated.

As used herein, terms such as "about" or "approximately" includes a stated value and an average value within an acceptable range of deviation of a particular value. The acceptable range of deviation is determined by a person of ordinary skill in the art in view of the measurement in question and the error associated with the measurement of a particular quantity (i.e., the limitations of the measurement system).

Exemplary embodiments are described herein with reference to sectional views and/or plan views as idealized exemplary drawings. In the drawings, thicknesses of layers and sizes of regions are enlarged for clarity. Variations in shape relative to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a curved feature. Thus, the regions shown in the accompanying drawings are schematic in nature, and their shapes are not intended to show actual shapes of regions in a device, and are not intended to limit the scope of the exemplary embodiments.

Transistors used in circuits provided in the embodiments of the present disclosure may be thin film transistors, field effect transistors or other switching devices with like characteristics. The embodiments of the present disclosure are described by taking an example where the transistors are thin film transistors.

In some embodiments, a control electrode of each transistor used in the shift register is a gate of the transistor, a first electrode of the transistor is one of a source and a drain of the transistor, and a second electrode of the transistor is another of the source and the drain of the transistor. Since the source and the drain of the transistor may be symmetrical in structure, there may be no difference in structure between the source and the drain of the transistor. That is, there may be no difference in structure between the first electrode and the second electrode of the transistor in the embodiments of the present disclosure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second electrode of the transistor is the source.

In the circuits provided in the embodiments of the present disclosure, the term "node" does not represent an existing component, but represents a junction point of relevant electrical connections in the circuit diagram. That is, the node is a node equivalent to the junction point of relevant electrical connections in the circuit diagram.

Hereinafter, the circuits provided in the embodiments of the present disclosure are described by taking an example where the transistors are N-type transistors.

Some embodiments of the present disclosure provide a shift register and a method of driving the same, a scan driving circuit and a display apparatus. The shift register, the method of driving the shift register, the scan driving circuit 1000 and the display apparatus are described below.

As shown in FIG. 1, some embodiments of the present disclosure provide the display apparatus 2000. The display apparatus 2000 may be any apparatus that displays an image whether in motion (e.g., videos) or stationary (e.g., a static images), and whether textual or graphical. More specifically, it is anticipated that the embodiments may be implemented in a variety of electronic apparatuses or associated with a variety of electronic apparatuses. The variety of electronic apparatuses include, but are not limited to: mobile phones, wireless apparatuses, personal data assistants (PDAs), hand-held or portable computers, GPS receivers/navigators, cameras, MPEG-4 Part 14 (MP4) video players, video cameras, game consoles, watches, clocks, calculators, television monitors, flat panel displays, computer monitors, automobile displays (e.g., odometer displays, etc.), navigators, cockpit controllers and/or displays, displays of camera views (e.g., displays of rear-view cameras in vehicles), electronic photos, electronic billboards or signs, projectors, building structures, packaging and aesthetic structures (e.g., displays for displaying an image of a piece of jewelry), etc.

In some examples, the display apparatus 2000 includes a frame, and a display panel PNL, a circuit board, a display driver integrated circuit (IC) and other electronic components that are disposed in the frame.

The display panel PNL may be, for example, an organic light emitting diode (OLED) display panel, a quantum dot light emitting diodes (QLED) display panel, a micro light emitting diodes (micro LED) display panel, or a mini light emitting diodes (mini LED), and the present disclosure is not limited thereto.

Some embodiments of the present disclosure are schematically described below by taking an example in which the display panel PNL is the OLED display panel.

Figure 2:
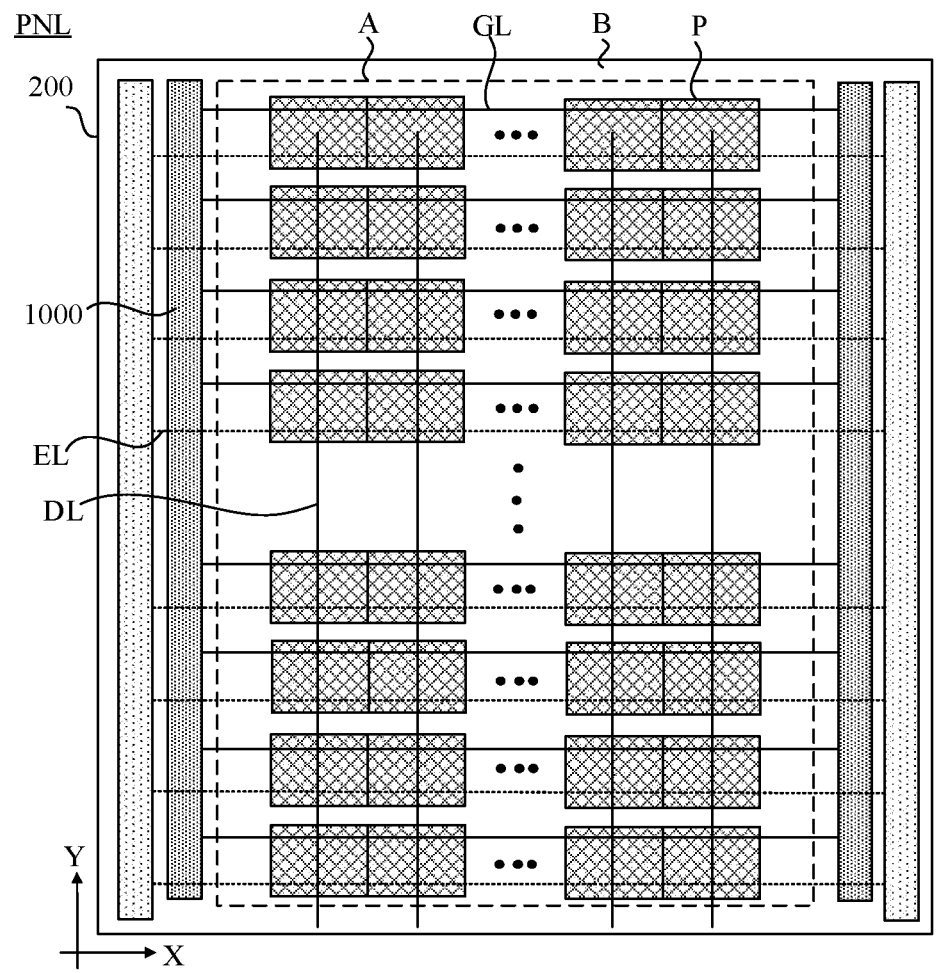
FIG. 2 is a structural diagram of a display panel, in accordance with some embodiments of the present disclosure.

In some embodiments, as shown in FIG. 2, the display panel PNL has a display region A and a bezel region B disposed on side(s) of the display region A. The "side(s)" refers to one side, two sides, three sides or peripheral side of the display region A. That is, the bezel region B may be located on one side, two sides or three sides of the display area A, or the bezel region B may be disposed around the display area A.

In some examples, as shown in FIG. 2, the display panel PNL may include: a substrate 200, and a plurality of sub-pixels P, a plurality of gate lines GL and a plurality of data lines DL that are disposed on a side of the substrate 200.

A type of the substrate 200 may be various, which may be selected according to actual needs.

For example, the substrate 200 may be a rigid substrate. The rigid substrate may be, for example, a glass substrate or a polymethyl methacrylate (PMMA) substrate.

For example, the substrate 200 may be a flexible substrate. The flexible substrate may be, for example, a polyethylene terephthalate (PET) substrate, a polyethylene naphthalate (PEN) substrate or a polyimide (PI) substrate. In this case, the display panel PNL may be a flexible display panel.

Optionally, as shown in FIG. 2, the plurality of sub-pixels P, the plurality of gate lines GL and the plurality of data lines DL may be located in the display region A, the plurality of gate lines GL may extend in a first direction X, and the plurality of data lines DL may extend in a second direction Y.

The first direction X and the second direction Y intersect with each other. An included angle between the first direction X and the second direction Y may be selectively provided according to actual needs. For example, the included angle between the first direction X and the second direction Y may be 85°, 88°, 90°, 92°, or 95°.

Figure 3:
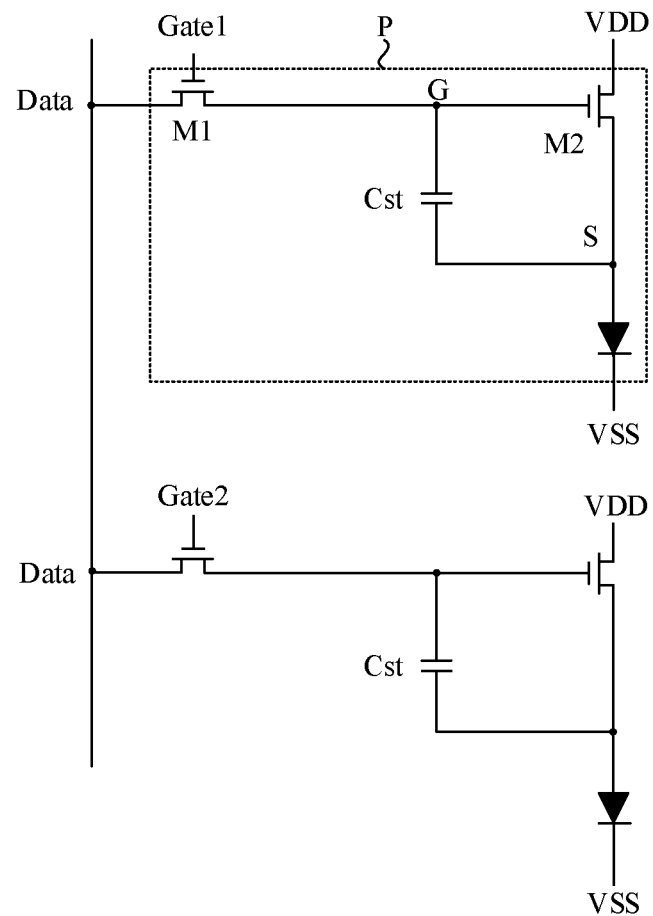
FIG. 3 is a circuit diagram of a sub-pixel, in accordance with some embodiments of the present disclosure.

In some examples, as shown in FIG. 3, in the plurality of sub-pixels P, each sub-pixel P may include a pixel driving circuit and a light-emitting device electrically connected to the pixel driving circuit. In a case where the display panel PNL is the OLED display panel, the light-emitting device is an OLED.

A structure of the pixel driving circuit has various types, which may be selected according to actual needs. For example, the structure of the pixel driving circuit may include a structure of "2T1C", "3T1C", "6T1C", "7T1C", "6T2C", or "7T2C". The "T" represents a transistor, a number in front of the "T" represents the number of transistors, the "C" represents a storage capacitor, and a number in front of the "C" represents the number of storage capacitors.

For example, the plurality of sub-pixels P may be arranged in an array. That is, the plurality of sub-pixels P may be arranged in rows in the first direction X, and arranged in columns in the second direction Y. Sub-pixels P arranged in a line in the first direction X may be referred to as sub-pixels P in a same row, and sub-pixels P arranged in a line in the second direction Y may be referred to as sub-pixels P in a same column. Pixel driving circuits in the sub-pixels P in the same row may be electrically connected to at least one gate line GL, and pixel driving circuits in the sub-pixels P in the same column may be electrically connected to a data line DL. The number of gate lines GL electrically connected to the pixel driving circuits in the sub-pixels P in the same row may be provided according to the structure of the pixel driving circuit. The embodiments of the present disclosure are described by taking an example in which the pixel driving circuits in the sub-pixels P in the same row are electrically connected one gate line GL.

Of course, as shown in FIG. 2, according to a structure of the pixel driving circuit, for example, the display panel PNL may further include a plurality of enable signal lines EL disposed on the side of the substrate 1 and extending in the first direction X.

For example, an enable signal line EL may be electrically connected to the pixel driving circuits in the sub-pixels P in the same row. The enable signal line EL may be arranged according to the structure of the pixel driving circuit.

In a display process of the display panel PNL, the sub-pixel P may receive a scanning signal from a corresponding gate line GL and a data signal from a corresponding data line DL, so as to generate a driving voltage to drive the light-emitting device in the sub-pixel P to emit light. Alternatively, the sub-pixel P may receive a scanning signal from a corresponding gate line GL, a data signal from a corresponding data line DL and an enable signal from a corresponding enable signal line EL, so as to generate a driving voltage to drive the light-emitting device in the sub-pixel P to emit light. The plurality of sub-pixels P cooperate with one another, so that the display panel PNL displays images.

The structure and a working process of the sub-pixel P are schematically described below by taking an example in which the pixel driving circuit is in the structure of "2T1C", the sub-pixels P in the same row are electrically connected to one gate line GL, and the same column of sub-pixels P are electrically connected to one data line DL.

For example, as shown in FIG. 3, the pixel driving circuit may include a switching transistor M1, a driving transistor M2 and a storage capacitor Cst. FIG. 3 shows a sub-pixel P in a first row and a sub-pixel P in a second row in the display panel PNL; Gate1 represents a gate signal terminal electrically connected to pixel driving circuits in sub-pixels P in the first row; and Gate2 represents a gate signal terminal electrically connected to pixel driving circuits in sub-pixels P in the second row.

For example, as shown in FIG. 3, a control electrode of the switching transistor M1 is electrically connected to the gate signal terminal Gate1, a first electrode of the switching transistor M1 is electrically connected to a data signal terminal Data, and a second electrode of the switching transistor M1 is electrically connected to a fourth node G. The switching transistor M1 is configured to transmit a data signal received at the data signal terminal Data to the fourth node G in response to a gate signal received at the gate signal terminal Gate1.

For example, as shown in FIG. 3, a control electrode of the driving transistor M2 is electrically connected to the fourth node G, a first electrode of the driving transistor M2 is electrically connected to a third voltage signal terminal VDD, and a second electrode of the driving transistor M2 is electrically connected to a fifth node S. The driving transistor M2 is configured to transmit a third voltage signal received at the third voltage signal terminal VDD to the fifth node S under control of a voltage of the fourth node G.

For example, as shown in FIG. 3, a first end of the storage capacitor Cst is electrically connected to the fourth node G, and a second end of the storage capacitor Cst is electrically connected to the fifth node S. The switching transistor M1 simultaneously charges the fourth node G and the storage capacitor Cst.

For example, as shown in FIG. 3, an anode of the light-emitting device is electrically connected to the fifth node S, and a cathode of the light-emitting device is electrically connected to a fourth voltage signal terminal VSS. The light-emitting device is configured to emit light under a cooperation of the third voltage signal from the fifth node S and a fourth voltage signal transmitted by the fourth voltage signal terminal VSS.

In these examples, in a display phase of a frame, the working process of the sub-pixel P may include, for example, a reset phase, a compensation phase, a data writing phase and a light-emitting phase.

It will be noted that, in the display phase of the frame, rows of sub-pixels P included in the display panel PNL simultaneously perform the reset phase and the compensation phase, then perform the data writing phase row by row, and then the rows of sub-pixels P simultaneously perform the light-emitting phase.

Figure 4:
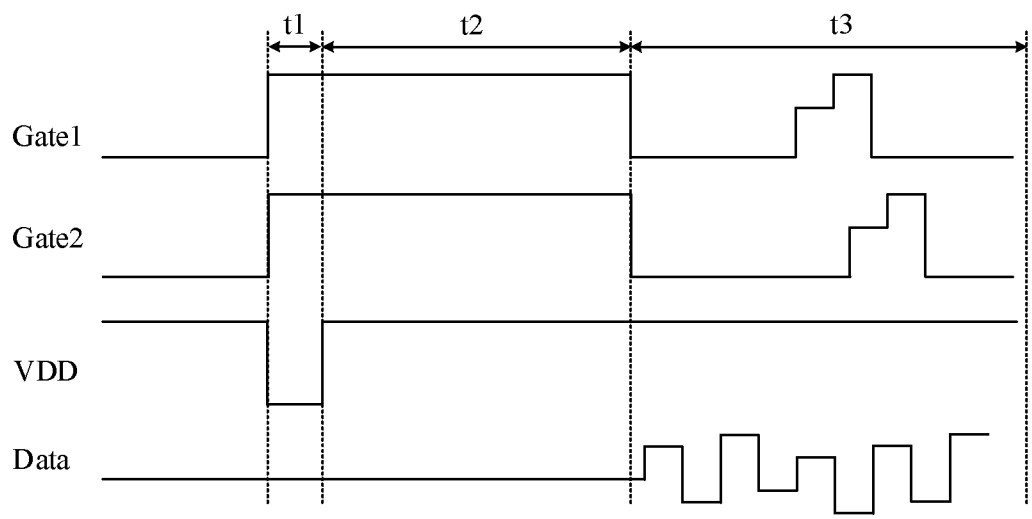
FIG. 4 is a timing diagram of the sub-pixel in FIG. 3, in accordance with some embodiments of the present disclosure.

Considering the sub-pixels P in the first row and the sub-pixels P in the second row as an example, with reference to FIGS. 3 and 4, working processes of the sub-pixels P in the first row and the sub-pixels P in the second row are schematically described below. As shown in FIG. 4, Gate1 represents a gate signal received by the pixel driving circuits in the sub-pixels P in the first row, and Gate2 represents a gate signal received by the pixel driving circuits in the sub-pixels P in the second row.

In the display phase of the frame, the working process of the sub-pixel P may include, for example, the reset phase t1, the compensation phase t2 and the data writing phase t3.

In the reset phase t1, a level of the gate signal is a high level, and a level of the third voltage signal is a low level.

In the sub-pixel P in the first row, the switching transistor M1 is turned on under control of the gate signal, receives the data signal, and transmits the data signal to the fourth node G. In this case, a level of the data signal is, for example, 3.5 V.

The driving transistor M2 is turned on under the control of the voltage of the fourth node G, receives the third voltage signal, and transmits the third voltage signal to the fifth node S, so as to reset the fifth node S and the anode of the light-emitting device.

In this phase, a working process of the pixel driving circuits in the sub-pixels P in the second row and a working process of the pixel driving circuits in the sub-pixels P in the first row are the same, which will not be repeated here.

In the reset phase t1, it is possible to reset pixel driving circuits in the rows of sub-pixels P in the display panel PNL.

In the compensation phase t2, the level of the gate signal is the high level, and the level of the third voltage signal is a high level.

In the sub-pixel P in the first row, the switching transistor M1 continues to be turned on under the control of the gate signal, and continues to transmit the data signal to the fourth node G.

The level of the third voltage signal changes from the low level to the high level. The driving transistor M2 may transmit the third voltage signal may be transmitted to the fifth node S to charge the fifth node S, and a voltage of the fifth node S is increased until the driving transistor M2 is turned off. In this case, a voltage difference Vgs between the fourth node G and the fifth node S is equal to a threshold voltage Vth of the driving transistor T2. Thus, a compensation to the driving transistor T2 is achieved.

In this phase, a working process of the pixel driving circuits in the sub-pixels P in the second row is the same as a working process of the pixel driving circuits in the sub-pixels P in the first row, which will not be repeated here.

In the compensation phase t2, the pixel driving circuits in the rows of sub-pixels P in the display panel PNL may be compensated.

In the data writing phase t3, the level of the gate signal changes from a low level to a high level and then from the high level to the low level.

In a period when the level of the gate signal is the low level, the switching transistor M1 is in an off state. When the level of the gate signal changes to the high level, the switching transistor M1 is turned on under the control of the gate signal, and transmits the data signal to the fourth node G. After the level of the gate signal changes to the low level, the switching transistor M1 is turned off under the control of the gate signal.

Here, gate signals respectively received by pixel driving circuits in sub-pixels P in different rows changes from low level to high level at different times. In this way, switching transistors M1 in the pixel driving circuits in the sub-pixels P in the different rows may be turned on at different times, thereby achieving row-by-row data writing.

It will be noted that, data signals required by the pixel driving circuits in the sub-pixels P in the different rows may be different. Thus, a waveform of the data signal transmitted to the pixel driving circuits in the sub-pixels in the same column may be irregular.

Of course, the working process of the sub-pixel P may further include, for example, the light-emitting phase.

After the rows of sub-pixels P in the display panel PNL completes the row-by-row data writing, the rows of sub-pixels P may be simultaneously driven to emit light.

In some examples, as shown in FIG. 2, the display panel PNL may further include a scan driving circuit 1000. The scan driving circuit 1000, the plurality of sub-pixels P, the plurality of gate lines GL and the plurality of data lines DL may be located on the same side of the substrate 200.

A position at which the scan driving circuit 1000 is provided may be various, which may be selected according to actual needs.

For example, as shown in FIG. 3, the scan driving circuit 1000 may be disposed in the bezel region B and located on a side of an extension direction of the plurality of gate lines GL.

For example, at least a portion of the scan driving circuit 1000 may be disposed in the display region A. In this way, it is beneficial to reduce an area occupied by the scan driving circuit 1000 in the bezel region B, and to reduce a size of the bezel region B. Thus, the display panel PNL and the display apparatus 2000 may achieve narrow bezel design.

Figure 19:
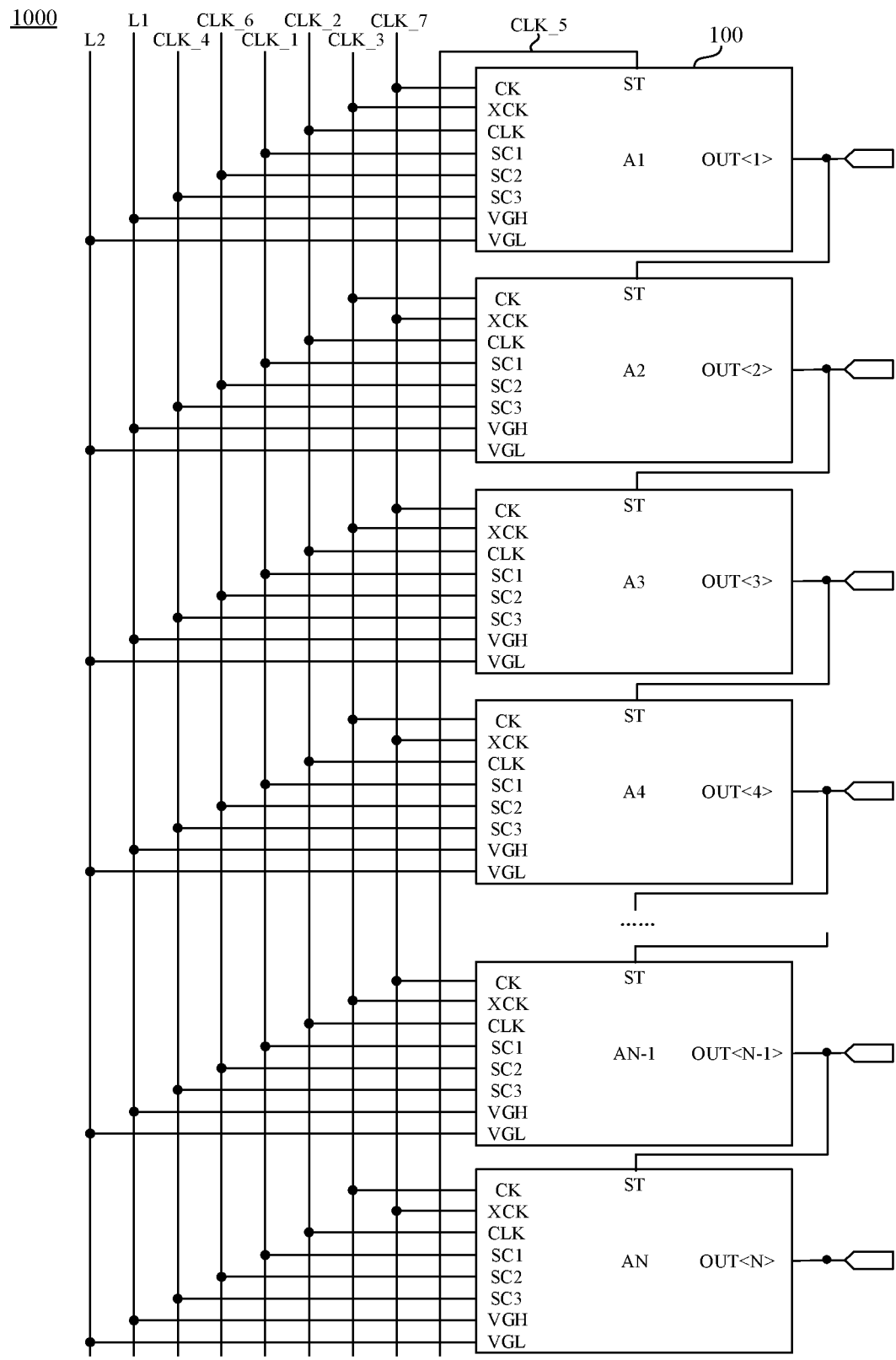
FIG. 19 is a structural diagram of a scan driving circuit, in accordance with some embodiments of the present disclosure.

For example, as shown in FIG. 19, the scan driving circuit 1000 includes a plurality of shift registers 100 that are connected in cascade. A shift register 100 may be electrically connected to pixel driving circuits in sub-pixels P in a row.

Here, in the display phase of the frame, the gate signal transmitted by the gate line GL is provided by the scan driving circuit 1000. Each shift register 100 in the scan driving circuit 1000 may be electrically connected to a corresponding gate line GL, and transmits a gate signal to a corresponding gate signal terminal through the gate line GL.

In the related art, a scan driving circuit generally includes three shift register groups, one shift register group is used for generating reset signals and transmitting the reset signals to a plurality of rows of sub-pixels in a display panel, another shift register group is used for generating compensation signals and transmitting the compensation signals to the rows of sub-pixels in the display panel, and yet another shift register group is used for generating gate signals and transmitting the gate signals to the rows of sub-pixels in the display panel. In this case, in a display phase of one frame, by using the three shift register groups, pixel driving circuits in the rows of sub-pixels may be reset simultaneously, the pixel driving circuits in the rows of sub-pixels may be compensated simultaneously, the pixel driving circuits in the rows of sub-pixels may perform data writing row-by-row, and light-emitting devices in the rows of sub-pixels are driven to emit light simultaneously. However, a structure of the scan driving circuit is complicated, and an area occupied by the scan driving circuit in the display panel is large. Therefore, in a case where the scan driving circuit is disposed in a bezel region, a size of the bezel region is large.

In the scan driving circuit 1000 provided in some embodiments of the present disclosure, a structure of the shift register 100 is various, which may be selected according to actual needs as long as required functions can be realized.

Figure 5:
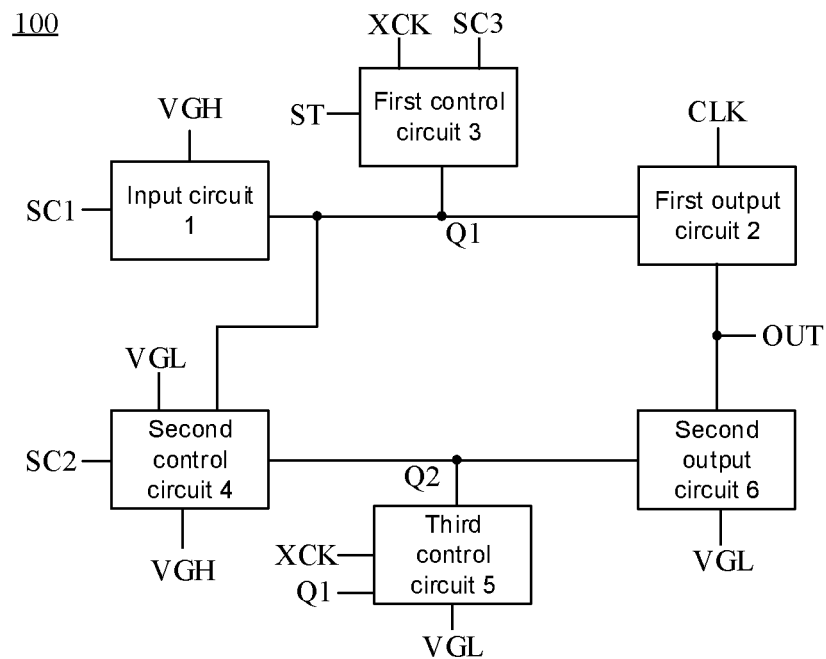
FIG. 5 is a structural diagram of a shift register, in accordance with some embodiments of the present disclosure.
Figure 6:
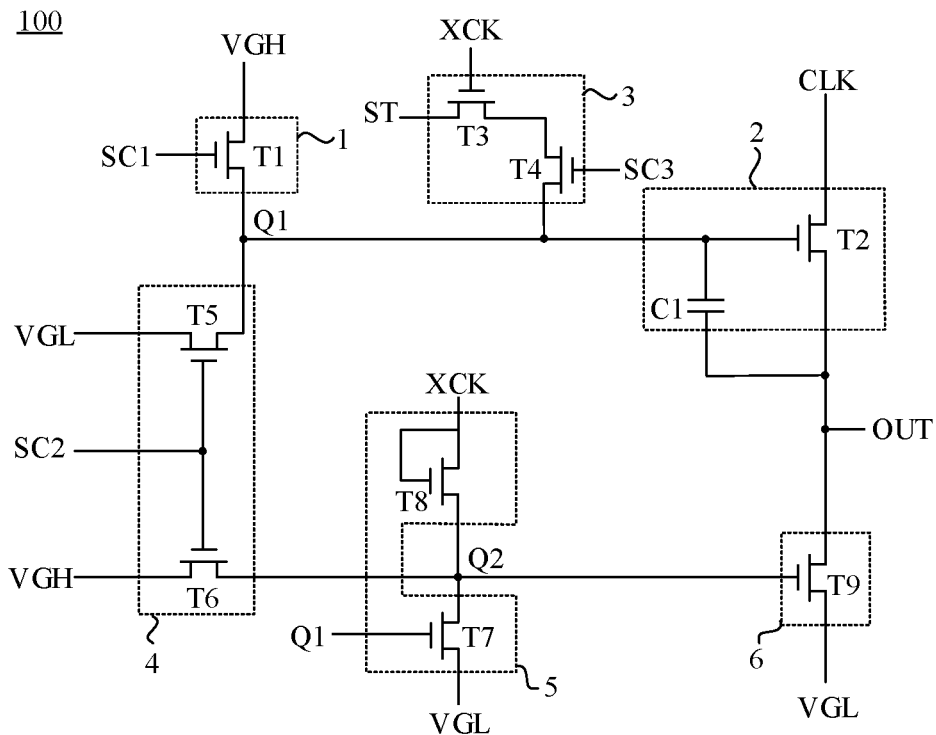
FIG. 6 is a circuit diagram of a shift register, in accordance with some embodiments of the present disclosure.

In some embodiments, as shown in FIGS. 5 and 6, the shift register 100 includes an input circuit 1, a first output circuit 2, a first control circuit 3, a second control circuit 4, a third control circuit 5 and a second output circuit 6.

In some examples, as shown in FIGS. 5 and 6, the input circuit 1 is electrically connected to a first clock signal terminal SC1, a first voltage signal terminal VGH and a first node Q1. The input circuit 1 is configured to transmit a first voltage signal received at the first voltage signal terminal VGH to the first node Q1 under control of a first clock signal transmitted by the first clock signal terminal SC1.

For example, the first voltage signal terminal VGH is configured to transmit a direct current high-level signal (e.g., higher than or equal to a high-level portion of a clock signal). The direct current high-level signal is referred to as the first voltage signal.

For example, in a case where a level of the first clock signal is a high level, the input circuit 1 may be turned on under the control of the first clock signal, receive the first voltage signal, and transmit the first voltage signal to the first node Q1 to charge the first node Q1. Thus, a voltage of the first node Q1 is increased.

In some examples, as shown in FIGS. 5 and 6, the first output circuit 2 is electrically connected to the first node Q1, a second clock signal terminal CLK and the scanning signal terminal OUT. The first output circuit 2 is configured to transmit a second clock signal received at the second clock signal terminal CLK to the scanning signal terminal OUT under control of the voltage of the first node Q1, so as to cause the scanning signal terminal OUT to output a scanning signal.

For example, in a case where the voltage of the first node Q1 is at a high level, the first output circuit 2 may be turned on under the control of the voltage of the first node Q1, receive the second clock signal, and transmit the second clock signal to the scanning signal terminal OUT, so that the second clock signal is output from the scanning signal terminal OUT as the scanning signal.

In some examples, as shown in FIGS. 5 and 6, the first control circuit 3 is electrically connected to a third clock signal terminal XCK, a fourth clock signal terminal SC3, a fifth clock signal terminal ST and the first node Q1. The first control circuit 3 is configured to transmit a fifth clock signal received at the fifth clock signal terminal ST to the first node Q1 under control of both a third clock signal transmitted by the third clock signal terminal XCK and a fourth clock signal transmitted by the fourth clock signal terminal SC3, so as to control the voltage of the first node Q1.

The fifth clock signal may be referred to as a trigger signal.

For example, in a case where a level of the third clock signal and a level of the fourth clock signal are both high levels, the first control circuit 3 may be turned on under the control of both the third clock signal and the fourth clock signal, receive the fifth clock signal, and transmit the fifth clock signal to the first node Q1. In a case where a level of the fifth clock signal is a high level, the first node Q1 may be charged by the fifth clock signal, so that the voltage of the first node Q1 is increased to be at a high level. In a case where the level of the fifth clock signal is a low level, the voltage of the first node Q1 may be pulled down by the fifth clock signal, so that the voltage of the first node Q1 is at a low level.

It will be noted that, in a case where both levels of the third clock signal and the fourth clock signal are low levels, or one of them is a high level and the other of them is a low level, the first control circuit 3 is in an off state.

In some examples, as shown in FIGS. 5 and 6, the second control circuit 4 is electrically connected to a sixth clock signal terminal SC2, a second voltage signal terminal VGL, the first node Q1, the first voltage signal terminal VGH and a second node Q2. The second control circuit 4 is configured to: under control of a sixth clock signal transmitted by the sixth clock signal terminal SC2, transmit a second voltage signal received at the second voltage signal terminal VGL to the first node Q1 to control the voltage of the first node Q1, and transmit the first voltage signal to the second node Q2 to control a voltage of the second node Q2.

The second voltage signal terminal VGL is configured to transmit a direct current low-level signal (e.g., lower than or equal to a low-level portion of the clock signal). The direct current low-level signal is referred to as the second voltage signal. The "high level" and the "low level" mentioned herein are relative, and a voltage value of the "high level" and a voltage value of the "low level" are not limited herein.

For example, in a case where a level of the sixth clock signal is a high level, the second control circuit 4 may be turned on under the control of the sixth clock signal. The second control circuit 4 may receive the second voltage signal, and transmit the second voltage signal to the first node Q1 to discharge the first node Q1, so that the voltage of the first node Q1 is pulled down to be at a low level. The second control circuit 4 may also receive the first voltage signal and transmit the first voltage signal to the second node Q2 to charge the second node Q2, so that the voltage of the second node Q2 is increased to be at a high level.

In some examples, as shown in FIGS. 5 and 6, the third control circuit 5 is electrically connected to the first node Q1, the second voltage signal terminal VGL, the third clock signal terminal XCK and the second node Q2. The third control circuit 5 is configured to control the voltage of the second node Q2 under cooperation of the voltage of the first node Q1 and the third clock signal.

For example, in a case where the voltage of the first node Q1 is at a high level, the third control circuit 5 may receive the second voltage signal, and transmit the second voltage signal to the second node Q2 to discharge the second node Q2, so that the voltage of the second node Q2 is pulled down to be at a low level.

In a case where the voltage of the first node Q1 is at a low level and the level of the third clock signal is a high level, the third control circuit 5 may receive the third clock signal, and transmit the third clock signal to the second node Q2 to charge the second node Q2, so that the voltage of the second node Q2 is pulled up to be at a high level.

It will be noted that, in a case where the voltage of the first node Q1 is at the high level, even if the level of the third clock signal is the high level, the voltage of the second node Q2 is mainly controlled by the second voltage signal. That is, the voltage of the second node Q2 is still at the low level.

In some examples, as shown in FIGS. 5 and 6, the second output circuit 6 is electrically connected to the second node Q2, the second voltage signal terminal VGL and the scanning signal terminal OUT. The second output circuit 6 is configured to transmit the second voltage signal to the scanning signal terminal OUT under control of the voltage of the second node Q2, so as to cause the scanning signal terminal OUT to output the scanning signal.

For example, in a case where the voltage of the second node Q2 is at a high level, the second output circuit 6 may be turned on under the control of the voltage of the second node Q2, receive the second voltage signal, and transmit the second voltage signal to the scanning signal terminal OUT, so that the second voltage signal is output from the scanning signal terminal OUT as the scanning signal.

It will be noted that the first output circuit 2 and the second output circuit 6 are turned on in different periods, and the scanning signal is composed of the second clock signal and the second voltage signal. The scanning signal corresponds to a gate signal received by a sub-pixel P.

Figure 17:
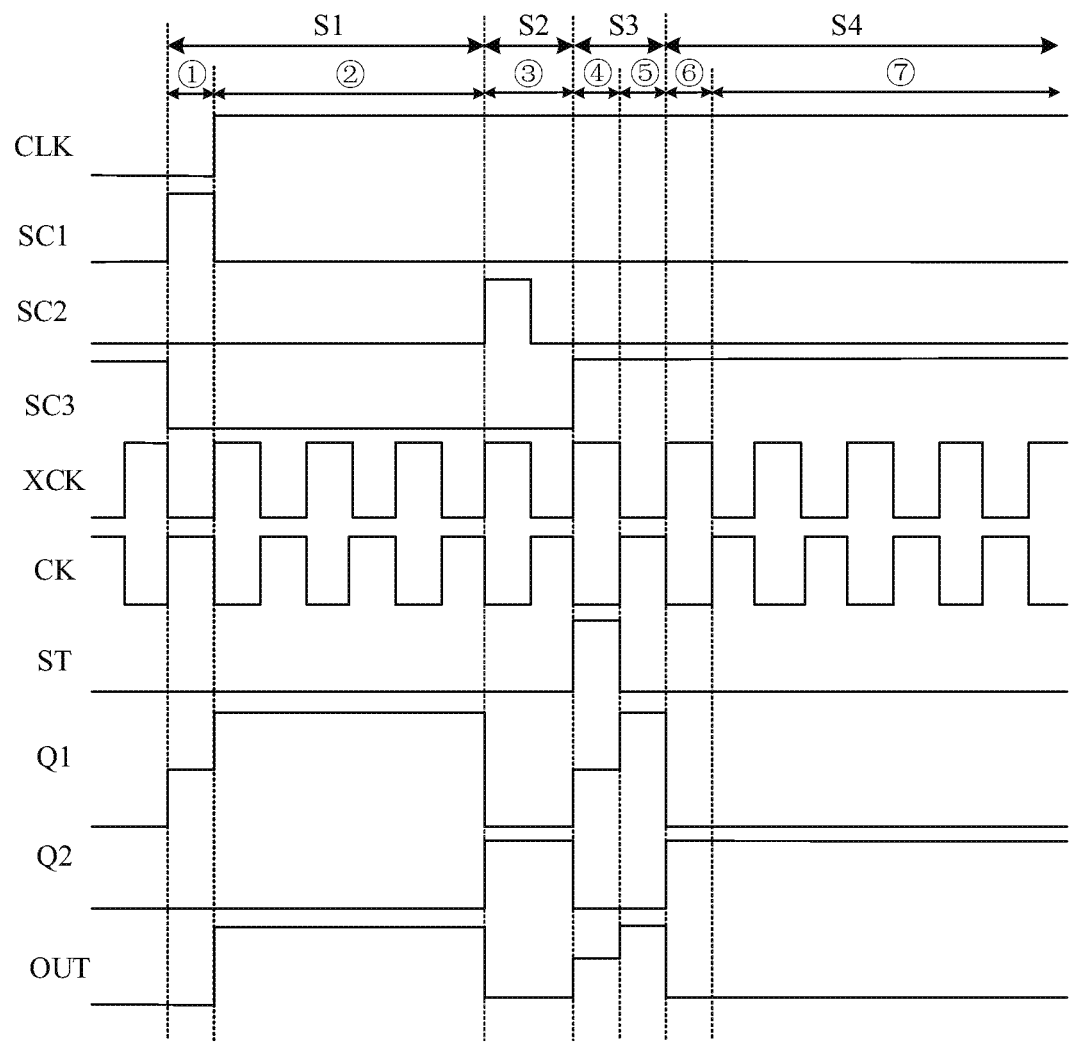
FIG. 17 is a timing diagram of the shift register in FIG. 16, in accordance with some embodiments of the present disclosure.

With reference to the structure shown in FIGS. 5 and 6, driving methods of the input circuit 1, the first output circuit 2, the first control circuit 3, the second control circuit 4, the third control circuit 5 and the second output circuit 6 included in the shift register 100 are schematically described below by taking a timing diagram as shown in FIG. 17 as an example.

As shown in FIG. 17, a working process of the shift register 100 includes: a first phase S1, a second phase S2, a third phase S3 and a fourth phase S4.

In the first phase S1, the level of the first clock signal is first a high level, and a level of the second clock signal is first a low level. When the level of the first clock signal changes from the high level to a low level, the level of the second clock signal changes from the low level to a high level. The level of the sixth clock signal is a low level.

The input circuit 1 is turned on in response to the first clock signal received at the first clock signal terminal SC1, and transmits the first voltage signal received at the first voltage signal terminal VGH to the first node Q1. The level of the first voltage signal is the high level, and after the input circuit 1 is turned on, the first node Q1 may be charged by the first voltage signal, so that the voltage of the first node Q1 is at a high level.

The first output circuit 2 is turned on under the control of the voltage of the first node Q1, and transmits the second clock signal received at the second clock signal terminal CLK to the scanning signal terminal OUT, so as to cause the scanning signal terminal OUT to output the scanning signal. In a period when the level of the first clock signal is the high level, the level of the second clock signal is the low level, so that a level of the scanning signal output by the scanning signal terminal OUT is a low level. The first output circuit 2 has a voltage storage function, so that the first output circuit 2 may store a high-level first clock signal. After the level of the first clock signal changes from the high level to the low level and the input circuit 1 is turned off, the first output circuit 2 may maintain the voltage of the first node Q1 at the high level, so that the first output circuit 2 is kept in an on state in the first phase S1. In this case, the level of the scanning signal output by the scanning signal terminal OUT is a high level.

Since the level of the sixth clock signal is the low level, the second control circuit 4 is in an off state.

The third control circuit 5 transmits the second voltage signal received at the second voltage signal terminal VGL to the second node Q2 under the control of the voltage of the first node Q1 to control the voltage of the second node Q2. In a case where the voltage of the first node Q1 is at the high level, the voltage of the second node Q2 is mainly controlled by the second voltage signal transmitted by the third control circuit 5. That is, whether the level of the third clock signal is a high level or a low level, the voltage of the second node Q2 is at a low level.

Since the voltage of the second node Q2 is at the low level, the second output circuit 6 is in an off state under the control of the voltage of the second node Q2.

In the second phase S2, the level of the first clock signal is a low level, and the level of the sixth clock signal is a high level.

The second control circuit 4 is turned on in response to the sixth clock signal received at the sixth clock signal terminal SC2, transmits the second voltage signal to the first node Q1 to control the voltage of the first node Q1, and transmits the first voltage signal to the second node Q2 to control the voltage of the second node Q2. In this case, the voltage of the first node Q1 is at a low level, and the voltage of the second node Q2 is at a high level.

Since the voltage of the first node Q1 is at the low level, the first output circuit 2 is in an off state under the control of the voltage of the first node Q1, and the third control circuit 5 does not transmit the second voltage signal to the second node Q2.

Since the voltage of the second node Q2 is at the high level, the second output circuit 6 is turned on under the control of the voltage of the second node Q2, and transmits the second voltage signal to the scanning signal terminal OUT, so as to cause the scanning signal terminal OUT to output the scanning signal. Since a level of the second voltage signal is a low level, in the second phase S2, the level of the scanning signal output by the scanning signal terminal OUT is a low level.

In the third phase S3, the level of the second clock signal is a high level, the level of the third clock signal is a high level, the level of the fourth clock signal is a high level, the level of the fifth clock signal is a high level, and the level of the six clock signal is a low level.

The first control circuit 3 transmits the fifth clock signal received at the fifth clock signal terminal ST to the first node Q1 in response to the third clock signal received at the third clock signal terminal XCK and the fourth clock signal received at the fourth clock signal terminal SC3, so as to control the voltage of the first node Q1. The level of the fifth clock signal is the high level, and after the first control circuit 3 is turned on, the first node Q1 may be charged by the fifth clock signal, so that the voltage of the first node Q1 is at a high level.

The first output circuit 2 is turned on under the control of the voltage of the first node Q1, and transmits the second clock signal to the scanning signal terminal, so as to cause the scanning signal terminal OUT to output the scanning signal. Since the level of the second clock signal is the high level, the level of the scanning signal output by the scanning signal terminal OUT is a high level. In this phase, even if the level of the third clock signal changes, the first output circuit 2 will maintain in the on state due to an action of the voltage storage function thereof, so that the scanning signal terminal OUT continues to output a high-level scanning signal.

Since the level of the sixth clock signal is the low level, the second control circuit 4 is in the off state.

The third control circuit 5 transmits the second voltage signal to the second node Q2 under the control of the voltage of the first node Q1 to control the voltage of the second node Q2. In a case where the voltage of the first node Q1 is at the high level, the voltage of the second node Q2 is at a low level.

Since the voltage of the second node Q2 is at the low level, the second output circuit 6 is in the off state under the control of the voltage of the second node Q2.

In the fourth phase S4, the level of the third clock signal is first a high level, the level of the fourth clock signal is a high level, the level of the fifth clock signal is a low level, and the level of the sixth clock signal is a low level.

The first control circuit 3 transmits the fifth clock signal to the first node Q1 in response to the third clock signal and the fourth clock signal, so as to control the voltage of the first node Q1. The level of the fifth clock signal is the low level, and after the first control circuit 3 is turned on, the first node Q1 may be discharged by the fifth clock signal, so that the voltage of the first node Q1 is at a low level.

Since the voltage of the first node Q1 is at the low level, the first output circuit 2 is in the off state under the control of the voltage of the first node Q1. Moreover, in this phase, the third control circuit 5 does not transmit the second voltage signal to the second node Q2.

Since the level of the sixth clock signal is the low level, the second control circuit 4 is in the off state.

The third control circuit 5 transmits the third clock signal to the second node Q2 in response to the third clock signal, so as to control the voltage of the second node Q2. Since the level of the third clock signal is first the high level, the third control circuit 5 may charge the second node Q2 through the third clock signal, which causes the voltage of the second node Q2 to be at a high level. The third clock signal alternates between a high level and a low level in this phase. Since the second control circuit 4 is in the off state, the second node Q2 substantially has no discharge path. Therefore, in a case where the level of the third clock signal changes from the high level to the low level, the voltage of the second node Q2 is substantially maintained at the high level; and after the level of the third clock signal changes from the low level to the high level, the second node Q2 may be further charged, and the voltage of the second node Q2 is maintained at the high level.

The second output circuit 6 is turned on under the control of the voltage of the second node Q2, and transmits the second voltage signal to the scanning signal terminal OUT, so as to cause the scanning signal terminal OUT to output the scanning signal. In this phase, the voltage of the second node Q2 is maintained at the high level, and the second output circuit 6 is kept in the on state, so that the scanning signal terminal OUT continues to output a low-level scanning signal.

Figure 18:
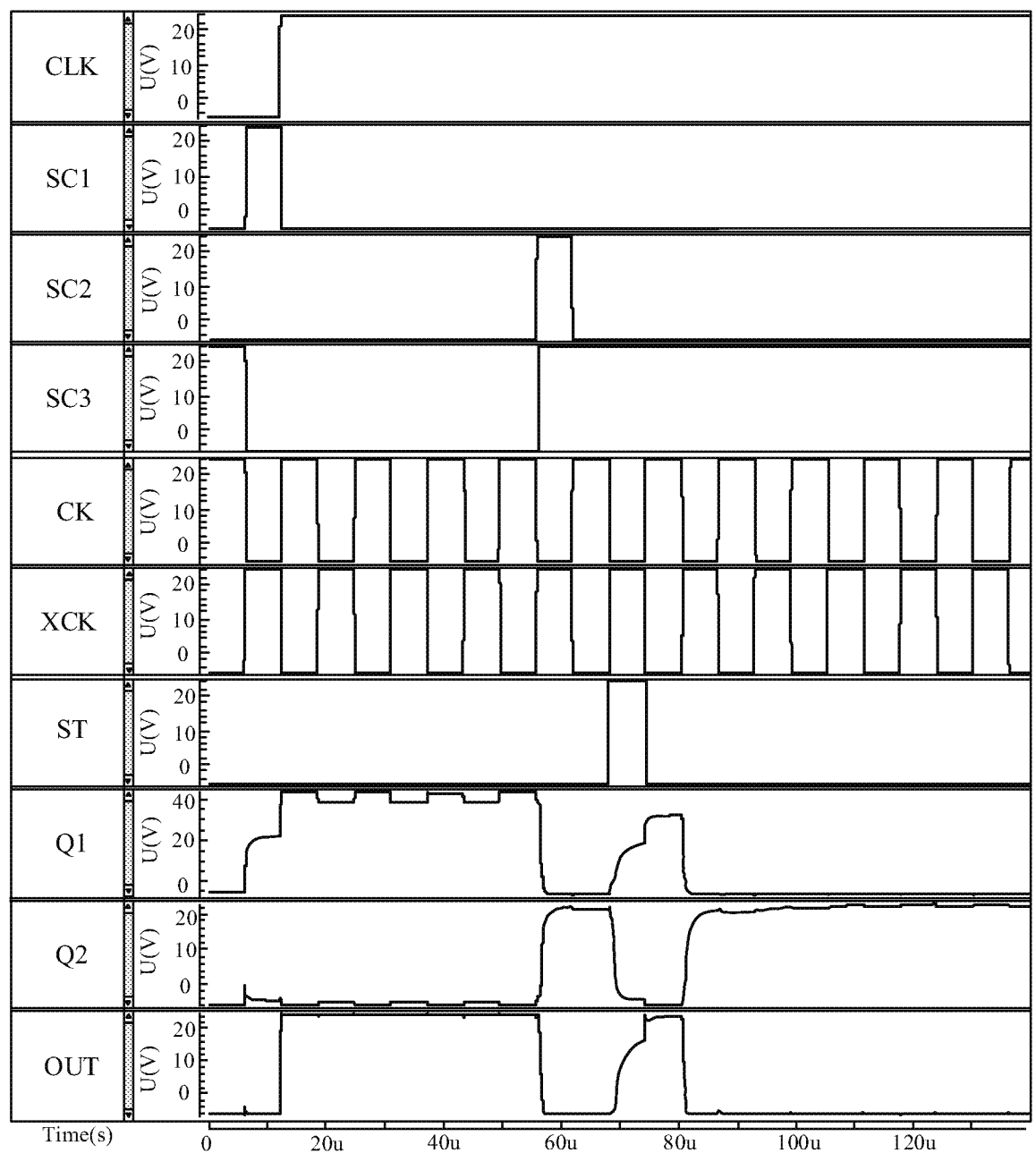
FIG. 18 is a simulation timing diagram of the shift register in FIG. 16, in accordance with some embodiments of the present disclosure.

With reference to FIGS. 4 and 17, a waveform of the scanning signal output by the shift register 100 in some examples of the present disclosure is the same as a waveform of the gate signal required by the sub-pixel P in the display panel PNL. As shown in FIGS. 4 and 18, the waveform of the scanning signal is the same as the waveform of the gate signal required by the sub-pixel P in the display panel PNL. That is, by using the shift register 100, the gate signal required by the sub-pixel P in the display panel PNL may be obtained.

The plurality of shift registers 100 are electrically connected to the rows of sub-pixels P in the display panel PNL, and the plurality of shift registers 100 may be used to provide working signals required for the pixel driving circuits in the rows of sub-pixels P. Therefore, in the display phase of the frame, the rows of sub-pixels P may simultaneously perform the reset phase, simultaneously perform the compensation phase, then perform the data writing phase row by row, and then simultaneously perform the light-emitting phase.

Thus, in the shift register 100 provided in some embodiments of the present disclosure, the input circuit 1, the first output circuit 2, the first control circuit 3, the second control circuit 4, the third control circuit 5 and the second output circuit 6 are provided, and each circuit is electrically connected to corresponding signal terminals. Due to cooperation of the circuits and the signal terminals, the first output circuit 2 and the second output circuit 6 may be turned on in different periods, and the second clock signal output by the first output circuit 2 and the second voltage signal output by the second output circuit 6 constitute the scanning signal. The waveform of the scanning signal is the same as the waveform of the gate signal required by the sub-pixel P in the display panel PNL. In this case, the shift register 100 may be used to provide the gate signal for the pixel driving circuit in the sub-pixel P in the display panel PNL, so as to realize display driving of the sub-pixel P. The shift register 100 performs the display driving on the sub-pixel P, which is conducive to increasing time of the data writing phase and the light-emitting phase, and to improving resolutions and refresh frequencies of the display panel PNL and the display apparatus 2000.

In addition, compared with the related art, the structure of the shift register 100 provided in the present disclosure is simpler, which is conducive to reducing complexities of structures of the shift register 100 and the scan driving circuit 1000, to improving manufacturing yields of the shift register 100 and the scan driving circuit 1000, and to reducing an area occupied by the shift register 100 and the scan driving circuit 1000. In this way, in a case where the shift register 100 and the scan driving circuit 1000 are disposed in the bezel region B, it is beneficial to reduce the size of the bezel region B, so that the display panel PNL and the display apparatus 2000 achieve the narrow bezel design. In a case where the shift register 100 and the scan driving circuit 1000 are disposed in the display region A, it is beneficial to reduce an area occupied by the shift register 100 and the scan driving circuit 1000 in the display region A, and it is convenient to plan arrangement positions of the shift register 100 and the scan driving circuit 1000.

With reference to FIG. 6, structures of the input circuit 1, the first output circuit 2, the first control circuit 3, the second control circuit 4, the third control circuit 5 and the second output circuit 6 included in the shift register 100 are schematically described below.

In some examples, as shown in FIG. 6, the input circuit 1 includes a first transistor T1.

For example, as shown in FIG. 6, a control electrode of the first transistor T1 is electrically connected to the first clock signal terminal SC1, a first electrode of the first transistor T1 is electrically connected to the first voltage signal terminal VGH, and a second electrode of the first transistor T1 is electrically connected to the first node Q1.

For example, in a case where the level of the first clock signal is the high level, the first transistor T1 may be turned on under the control of the first clock signal, receive the first voltage signal, and transmit the first voltage signal to the first node Q1, so as to pull up the voltage of the first node Q1.

In some examples, as shown in FIG. 6, the first output circuit 2 includes a second transistor T2 and a first capacitor C1.

For example, as shown in FIG. 6, a control electrode of the second transistor T2 is electrically connected to the first node Q1, a first electrode of the second transistor T2 is electrically connected to the second clock signal terminal CLK, and a second electrode of the second transistor T2 is electrically connected to the scanning signal terminal OUT.

For example, in a case where the voltage of the first node Q1 is at the high level, the second transistor T2 may be turned on under the control of the voltage of the first node Q1, receive the second clock signal, and transmit the second clock signal to the scanning signal terminal OUT. In this case, the second clock signal may be output from the scanning signal terminal OUT as the scanning signal.

For example, as shown in FIG. 6, a first end of the first capacitor C1 is electrically connected to the first node Q1, and a second end of the first capacitor C1 is electrically connected to the scanning signal terminal OUT.

For example, when the first transistor T1 charges the first node Q1 with the first voltage signal, the first capacitor C1 is also charged. In a case where the level of the first clock signal is the low level, the first transistor T1 may be turned off under the control of the first clock signal, and the first capacitor C1 may be discharged, so that the voltage of the first node Q1 is maintained at the high level, and the second transistor T2 is maintained in the on state.

In some examples, as shown in FIG. 6, the first control circuit 3 includes a third transistor T3 and a fourth transistor T4.

For example, as shown in FIG. 6, a control electrode of the third transistor T3 is electrically connected to the third clock signal terminal XCK, a first electrode of the third transistor T3 is electrically connected to the fifth clock signal terminal ST, and a second electrode of the third transistor T3 is electrically connected to a first electrode of the fourth transistor T4. A control electrode of the fourth transistor T4 is electrically connected to the fourth clock signal terminal SC3, and a second electrode of the fourth transistor T4 is electrically connected to the first node Q1.

For example, in a case where the level of the third clock signal is the high level, the third transistor T3 may be turned on under control of the third clock signal, receive the fifth clock signal, and transmit the fifth clock signal to the first electrode of the fourth transistor T4. In a case where the level of the fourth clock signal is the high level, the fourth transistor T4 may be turned on under control of the fourth clock signal, and transmit the fifth clock signal to the first node Q1. The voltage of the first node Q1 depends on the level of the fifth clock signal.

Here, in a case where the level of the third clock signal and the level of the fourth clock signal are both high levels, the fifth clock signal may be transmitted to the first node Q1 through the third transistor T3 and the fourth transistor T4 sequentially.

In some examples, as shown in FIG. 6, the second control circuit 4 includes a fifth transistor T5 and a sixth transistor T6.

For example, as shown in FIG. 6, a control electrode of the fifth transistor T5 is electrically connected to the sixth clock signal terminal SC2, a first electrode of the fifth transistor T5 is electrically connected to the second voltage signal terminal VGL, and a second electrode of the fifth transistor T5 is electrically connected to the first node Q1.

For example, in a case where the level of the sixth clock signal is the high level, the fifth transistor T5 may be turned on under the control of the sixth clock signal, receive the second voltage signal, and transmit the second voltage signal to the first node Q1 to discharge the first node Q1, so that the voltage of the first node Q1 is pulled down to be at the low level.

For example, as shown in FIG. 6, a control electrode of the sixth transistor T6 is electrically connected to the sixth clock signal terminal SC2, a first electrode of the sixth transistor T6 is electrically connected to the first voltage signal terminal VGH, and a second electrode of the sixth transistor T6 is electrically connected to the second node Q2.

For example, in the case where the level of the sixth clock signal is the high level, the sixth transistor T6 may be turned on under the control of the sixth clock signal, receive the first voltage signal, and transmit the first voltage signal to the second node Q2 to charge the second node Q2, so that the voltage of the second node Q2 is pulled up to be at the high level.

In some examples, as shown in FIG. 6, the third control circuit 5 includes a seventh transistor T7 and an eighth transistor T8.

For example, as shown in FIG. 6, a control electrode of the seventh transistor T7 is electrically connected to the first node Q1, a first electrode of the seventh transistor T7 is electrically connected to the second voltage signal terminal VGL, and a second electrode of the seventh transistor T7 is electrically connected to the second node Q2.

For example, in a case where the voltage of the first node Q1 is at the high level, the seventh transistor T7 may be turned on under the control of the voltage of the first node Q1, receive the second voltage signal, and transmit the second voltage signal to the second node Q2 to discharge the second node Q2, so that the voltage of the second node Q2 is pulled down to be at the low level.

For example, as shown in FIG. 6, a control electrode of the eighth transistor T8 is electrically connected to the third clock signal terminal XCK, a first electrode of the eighth transistor T8 is electrically connected to the third clock signal terminal XCK, and a second electrode of the eighth transistor T8 is electrically connected to the second node Q2.

For example, in a case where the level of the third clock signal is the high level, the eighth transistor T8 may be turned on under the control of the third clock signal, receive the third clock signal, and transmit the third clock signal to the second node Q2 to charge the second node Q2, so that the voltage of the second node Q2 is pulled up to be at the high level.

It will be noted that, in the case where the voltage of the first node Q1 is at the high level, the voltage of the second node Q2 is mainly controlled by the second voltage signal.

For example, a width-to-length ratio of the seventh transistor T7 is greater than a width-to-length ratio of the eighth transistor T8.

In this way, in a case where the seventh transistor T7 is turned on, it may be ensured that the voltage of the second node Q2 is controlled by the second voltage signal transmitted by the seventh transistor T7. That is, in the case where the seventh transistor T7 is turned on, whether the eighth transistor T8 is turned on or not, it may be ensured that the voltage of the second node Q2 is at the low level. Thus, it is conducive to preventing the voltage of the second node Q2 from being affected by the third clock signal transmitted by the eighth transistor T8, and stability of the voltage of the second node Q2 is ensured.

In some examples, as shown in FIG. 6, the second output circuit 6 includes a ninth transistor T9.

For example, as shown in FIG. 6, a control electrode of the ninth transistor T9 is electrically connected to the second node Q2, a first electrode of the ninth transistor T9 is electrically connected to the second voltage signal terminal VGL, and a second electrode of the ninth transistor T9 is electrically connected to the scanning signal terminal OUT.

For example, in a case where the voltage of the second node Q2 is at the high level, the ninth transistor T9 may be turned on under the control of the voltage of the second node Q2, receive the second voltage signal, and transmit the second voltage signal to the scanning signal terminal OUT. In this case, the second voltage signal may be output from the scanning signal terminal OUT as the scanning signal.

Figure 7:
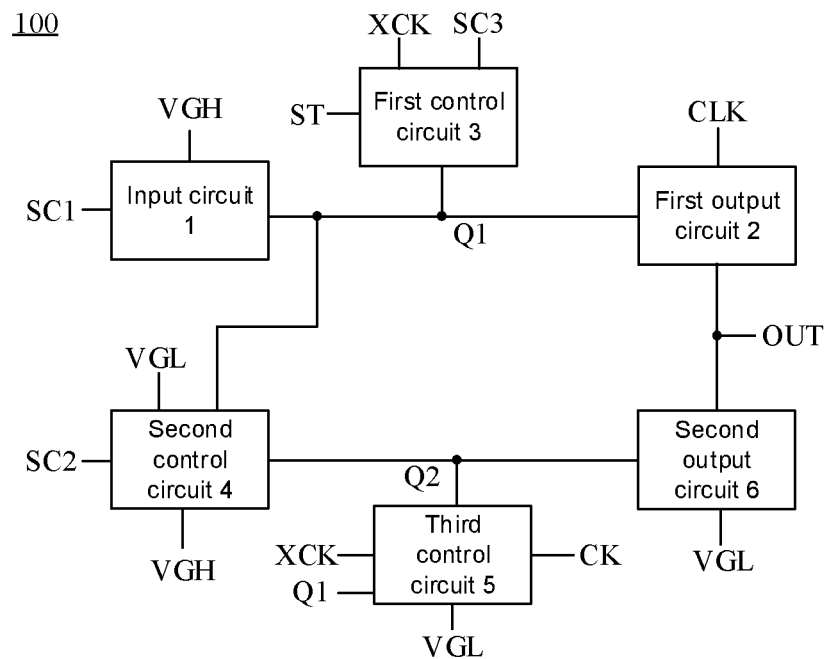
FIG. 7 is a structural diagram of another shift register, in accordance with some embodiments of the present disclosure.
Figure 8:
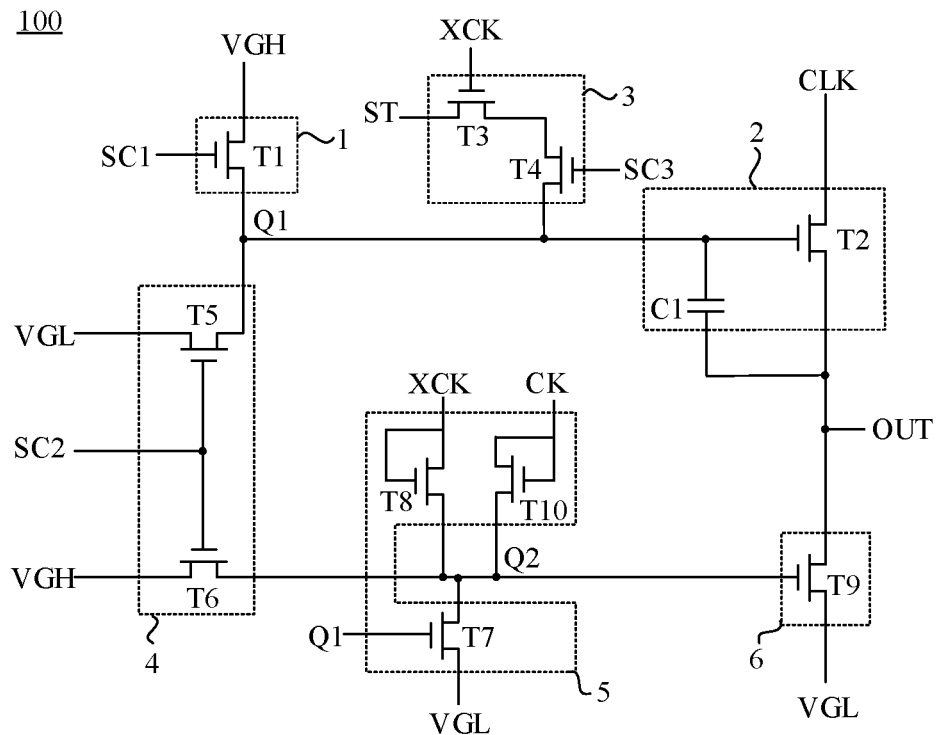
FIG. 8 is a circuit diagram of another shift register, in accordance with some embodiments of the present disclosure.

In some embodiments, as shown in FIGS. 7 and 8, the third control circuit 5 is further electrically connected to a seventh clock signal terminal CK. The third control circuit 5 is further configured to control the voltage of second node Q2 under cooperation of a seventh clock signal transmitted by the seventh clock signal terminal CK, the voltage of the first node Q1 and the third clock signal.

For example, in a case where the voltage of the first node Q1 is at the low level, the level of the third clock signal is the low level and a level of the seventh clock signal is a high level, the third control circuit 5 may receive the seventh clock signal and transmit the seventh clock signal to the second node Q2 to charge the second node Q2, so that the voltage of the second node Q2 is pulled up to be at a high level.

It will be noted that, in these examples, in a case where the voltage of the first node Q1 is at the high level, whether the level of the third clock signal is the high level or the level of the seventh clock signal is the high level, the voltage of the second node Q2 is still mainly controlled by the level of the second voltage signal.

In some examples, as shown in FIG. 17, the seventh clock signal and the third clock signal are inverted signals to each other.

For example, the "inverted signals" mean that, in a certain period, the level of the seventh clock signal and the level of the third clock signal do not change, in a case where the level of the seventh clock signal is the high level, the level of the third clock signal is the low level, and in a case where the level of the seventh clock signal is a low level, the level of the third clock signal is the high level.

For example, as shown in FIG. 17, the level of the seventh clock signal changes from the high level to the low level, and the level of the third clock signal changes from the low level to the high level at the same time. The level of the seventh clock signal changes from the low level to the high level, and the level of the third clock signal changes from the high level to the low level at the same time.

As another example, in a certain period, when the level of the seventh clock signal changes from the low level to the high level, the level of the third clock signal changes from the high level to the low level. Before the level of the seventh clock signal changes from the high level to the low level, the level of the third clock signal changes from the low level to the high level.

Of course, the level of the seventh clock signal and the level of the third clock signal may be provided in other manners, as long as it may satisfy that at least one of levels of the seventh clock signal and the third clock signal is a high level in a corresponding period, so that the third control circuit 5 transmits corresponding clock signal(s) to the second node Q2.

The embodiments of the present disclosure are schematically described by taking an example in which the level of the seventh clock signal and the level of the third clock signal change simultaneously.

It will be seen from the above that in a working process of the third control circuit 5, the third control circuit 5 may transmit one of the seventh clock signal and the third clock signal to the second node Q2. For example, in the case where the voltage of the first node Q1 is at the low level, if the level of the seventh clock signal is the high level, and the level of the third clock signal is the low level, the third control circuit 5 may transmit the seventh clock signal to the second node Q2 to charge the second node Q2; and if the level of the seventh clock signal is the low level, and the level of the third clock signal is the high level, the third control circuit 5 may transmit the third clock signal to the second node Q2 to charge the second node Q2.

By electrically connecting the third control circuit 5 to the seventh clock signal terminal CK, and providing the seventh clock signal and the third clock signal as the inverted signals, the second node Q2 may be continuously charged in the case where the voltage of the first node Q1 is at the low level, so that the voltage of the second node Q2 is maintained at a high level, that is, the voltage of the second node Q2 is in a controllable state. In this way, it is conducive to improving anti-interference capability of the shift register 100 and keeping the second output circuit 6 electrically connected to the second node Q2 in a stable on state, and further to improving accuracy of the scanning signal output by the scanning signal terminal OUT.

In some examples, as shown in FIG. 8, the third control circuit 5 further includes a tenth transistor T10.

For example, as shown in FIG. 8, a control electrode of the tenth transistor T10 is electrically connected to the seventh clock signal terminal CK, a first electrode of the tenth transistor T10 is electrically connected to the seventh clock signal terminal CK, and a second electrode of the tenth transistor T10 is electrically connected to the second node Q2.

For example, in a case where the level of the seventh clock signal is the high level, the tenth transistor T10 may be turned on under control of the seventh clock signal, receive the seventh clock signal, and transmit the seventh clock signal to the second node Q2 to charge the second node Q2, so that the voltage of the second node Q2 is pulled up to be at a high level.

Since the seventh clock signal and the third clock signal are the inverted signals to each other, the eighth transistor T8 and the tenth transistor T10 in the third control circuit 5 may be turned on alternately. In this way, in a case where the seventh transistor T7 is turned off due to the low-level voltage of the first node Q1, the eighth transistor T8 and the tenth transistor T10 may alternately transmit a high-level third clock signal and a high-level seventh clock signal to the second node Q2. Thus, the second node Q2 is continuously charged, which causes the voltage of the second node Q2 to be in a stable state.

Therefore, the anti-interference capability of the shift register 100 may be effectively improved. In a process that the second output circuit 6 is turned on to output the scanning signal, the second output circuit 6 can be ensured to be in the stable on state, thereby improving the accuracy of the scanning signal output by the scanning signal terminal OUT.

For example, in a case where the third control circuit 5 includes the seventh transistor T7, the width-to-length ratio of the seventh transistor T7 is greater than a width-to-length ratio of the tenth transistor T10.

Similarly to the eighth transistor T8, by setting a magnitude relationship between the width-to-length ratio of the seventh transistor T7 and the width-to-length ratio of the tenth transistor T10, when the seventh transistor T7 is turned on, whether the tenth transistor T10 is turned on or not, it may be ensured that the voltage of the second node Q2 is at the low level and is mainly controlled by the second voltage signal transmitted by the seventh transistor T7. Thus, it is conducive to preventing the voltage of the second node Q2 from being affected by the seventh clock signal transmitted by the tenth transistor T10, and the stability of the voltage of the second node Q2 is ensured.

Figure 9:
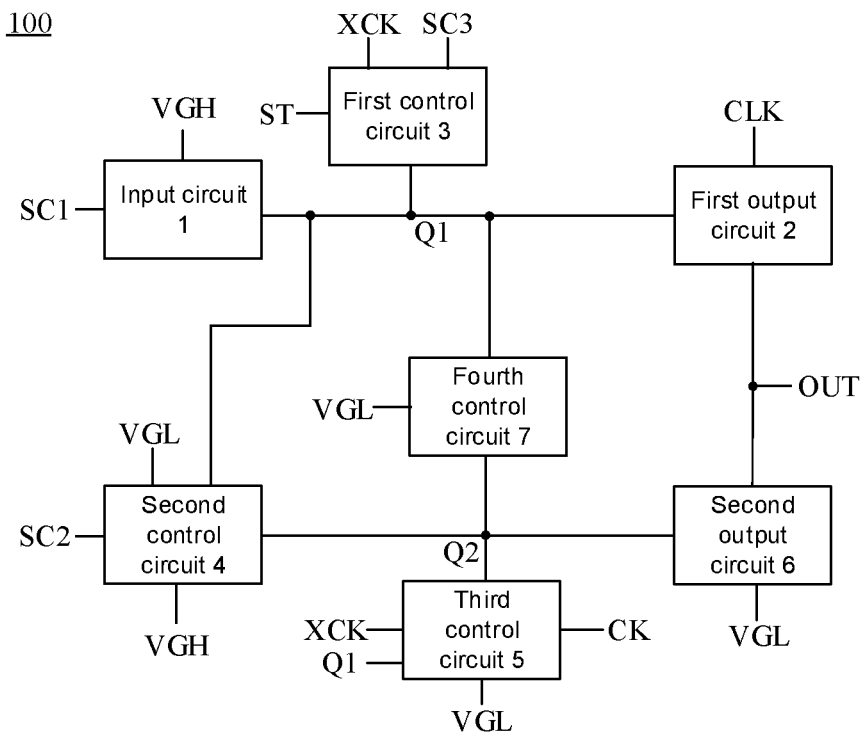
FIG. 9 is a structural diagram of yet another shift register, in accordance with some embodiments of the present disclosure.
Figure 10:
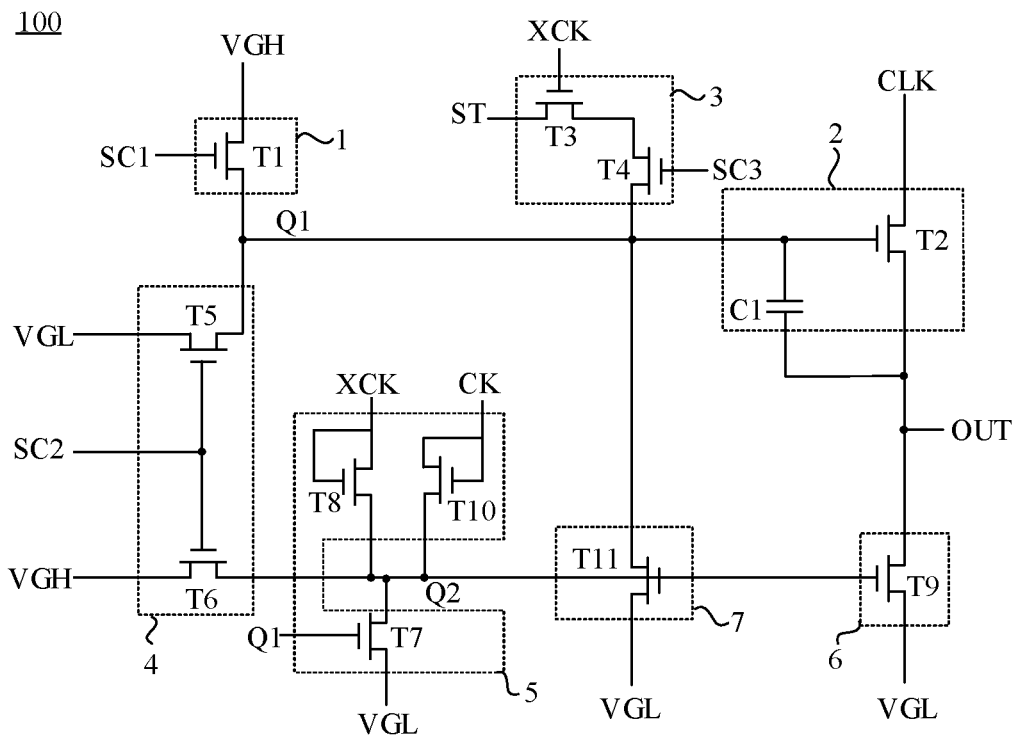
FIG. 10 is a circuit diagram of yet another shift register, in accordance with some embodiments of the present disclosure.

In some embodiments, as shown in FIGS. 9 and 10, the shift register 100 further includes a fourth control circuit 7.

In some examples, as shown in FIGS. 9 and 10, the fourth control circuit 7 is electrically connected to the second node Q2, the second voltage signal terminal VGL and the first node Q1. The fourth control circuit 7 is configured to transmit the second voltage signal to the first node Q1 under the control of the voltage of the second node Q2.

For example, in a case where the voltage of the second node Q2 is at the high level, the fourth control circuit 7 may be turned on under the control of the voltage of the second node Q2, receive the second voltage signal, and transmit the second voltage signal to the first node Q1 to discharge the first node Q1, so that the voltage of the first node Q1 is pulled down to be at a low level.

By providing the fourth control circuit 7, the voltage of the first node Q1 may be pulled down to be at the low level in the case where the voltage of the second node Q2 is at the high level, so that the first output circuit 2 is in the off state under the control of the voltage of the first node Q1. In this way, the first output circuit 2 may be ensured to be turned off when the second output circuit 6 is turned on, thereby preventing the first output circuit 2 from outputting the second clock signal in a process of the second output circuit 6 outputting the second voltage signal as the scanning signal. Thus, it is conducive to improving the accuracy of the scanning signal, and to improving reliability of the shift register 100.

With reference to FIG. 10A, a structure of the fourth control circuit 7 is schematically described below.

In some examples, as shown in FIG. 10, the fourth control circuit 7 includes an eleventh transistor T11.

For example, as shown in FIG. 10, a control electrode of the eleventh transistor T11 is electrically connected to the second node Q2, a first electrode of the eleventh transistor T11 is electrically connected to the second voltage signal terminal VGL, and a second electrode of the eleventh transistor T11 is electrically connected to the first node Q1.

For example, in a case where the voltage of the second node Q2 is at the high level, the eleventh transistor T11 may be turned on under the control of the voltage of the second node Q2, receive the second voltage signal, and transmit the second voltage signal to the first node Q1, so that the voltage of the first node Q1 is pulled down to be at a low level.

By providing the eleventh transistor T11, the voltage of the first node Q1 may be pulled down to be at the low level in the case where the voltage of the second node Q2 is at the high level, so as to ensure the stable on state of the second output circuit 6 and the accuracy of the scanning signal output by the scanning signal terminal OUT. The structure of the fourth control circuit 7 is simple, which is conducive to simplifying the structure of the shift register 100 and improving the manufacturing yield of the shift register 100.

Figure 11:
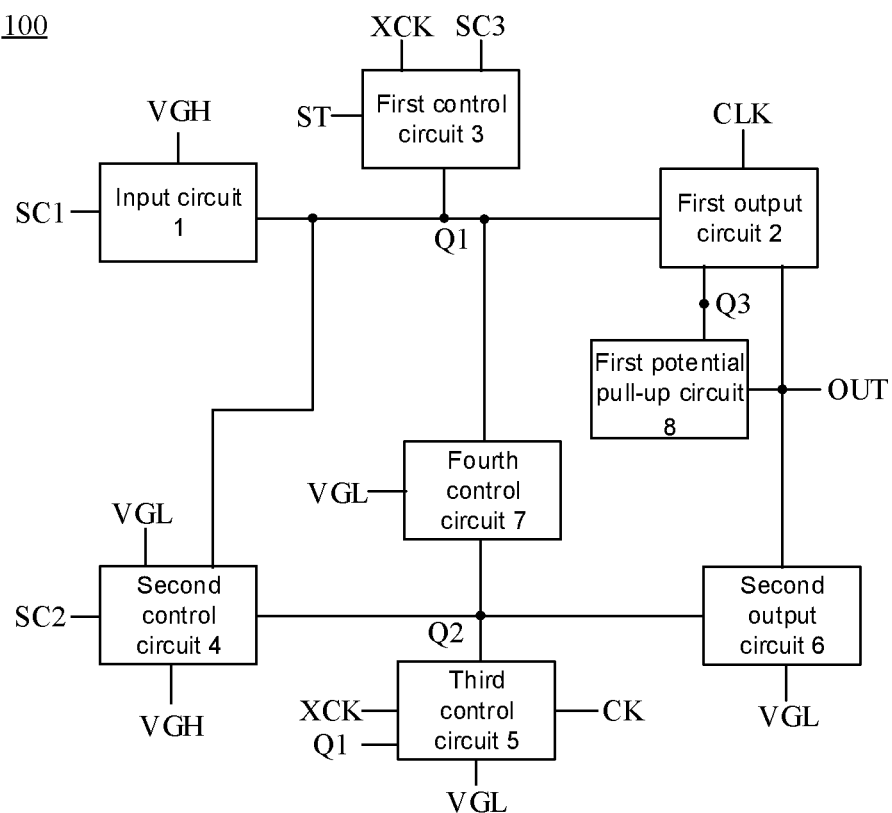
FIG. 11 is a structural diagram of yet another shift register, in accordance with some embodiments of the present disclosure.
Figure 12:
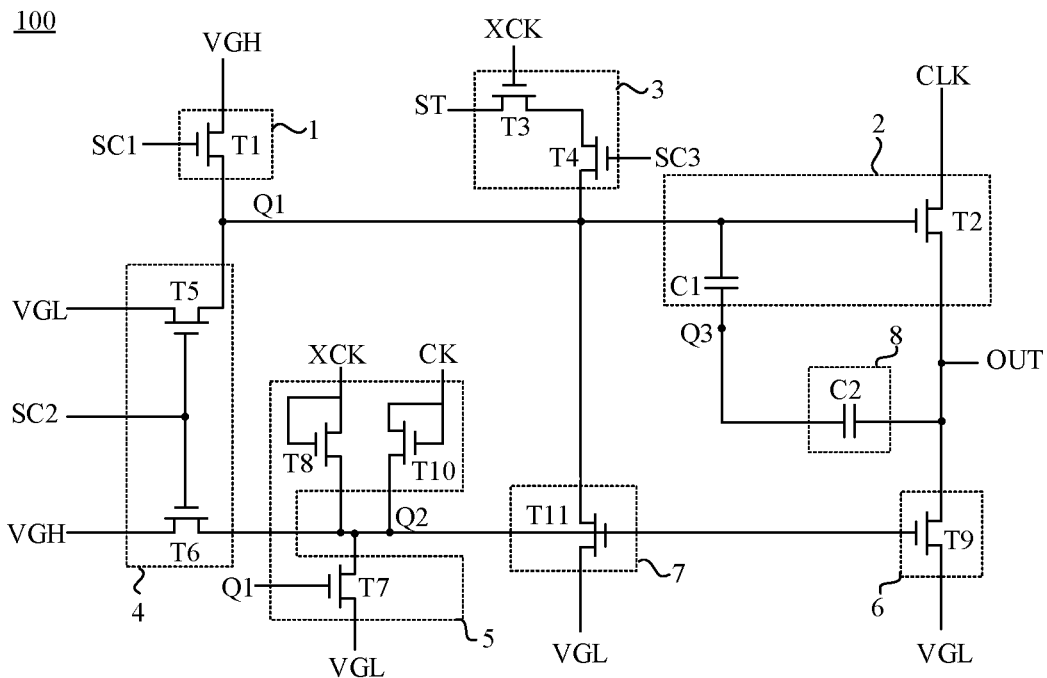
FIG. 12 is a circuit diagram of yet another shift register, in accordance with some embodiments of the present disclosure.

In some embodiments, as shown in FIGS. 11 and 12, the shift register 100 further includes a first potential pull-up circuit 8.

In some examples, as shown in FIGS. 11 and 12, the first potential pull-up circuit 8 is electrically connected to the scanning signal terminal OUT and a third node Q3. Based on this, the first output circuit 2 is further electrically connected to the third node Q3. The first potential pull-up circuit 8 is configured to pull up the voltage of the first node Q1 with the scanning signal in a phase in which the first output circuit 2 causes the scanning signal terminal OUT to output the scanning signal.

For example, in a case where the first node Q1 is at the high level, the first output circuit 2 may be turned on under the control of the voltage of the first node Q1, and output the second clock signal from the scanning signal terminal OUT as the scanning signal. In this phase, the input circuit 1 is generally in the off state after transmitting the first voltage signal to the first node Q1, so that the first node Q1 is in a floating state.

In a case where the second clock signal output by the scanning signal terminal OUT changes from the low level to the high level, the voltage of the first node Q1 is further pulled up based on a coupling bootstrap effect of the first potential pull-up circuit 8.

By providing the first potential pull-up circuit 8, the voltage of the first node Q1 may be further pulled up in the phase in which the first output circuit 2 causes the scanning signal terminal OUT to output the scanning signal, which is conducive to ensuring that the second transistor T2 in the first output circuit 2 is in a relatively full-on state. Thus, it is ensuring that the scanning signal terminal OUT may output losslessly, and the accuracy of the scanning signal and the reliability of the shift register 100 are improved.

With reference to FIG. 12, a structure of the first potential pull-up circuit 8 is schematically described below.

In some examples, as shown in FIG. 12, the first potential pull-up circuit 8 includes a second capacitor C2.

For example, as shown in FIG. 12, a first end of the second capacitor C2 is electrically connected to the scanning signal terminal OUT, and a second end of the second capacitor C2 is electrically connected to the third node Q3. In a case where the first output circuit 2 includes the first capacitor C2, the second end of the first capacitor C1 is electrically connected to the scanning signal terminal OUT through the second capacitor C2. That is, the second capacitor C2 and the first capacitor C1 are connected in series.

For example, in a case where the first output circuit 2 is turned on and the second clock signal received by the scanning signal terminal OUT changes from the low level to the high level, a coupling bootstrap may occur in the second capacitor C2 in this process, so that the voltage of the first node Q1 is increased.

It will be noted that in a case where the input circuit 1 is turned off after transmitting the first voltage signal to the first node Q1, the first node Q1 is in the floating state. In this case, the first capacitor C1 in the first output circuit 2 may be discharged, so that the voltage of the first node Q1 is maintained at the high level.

By providing the second capacitor C2 and connecting the second capacitor C2 and the first capacitor C1 in series, in the case where the first output circuit 2 is turned on and the second clock signal received by the scanning signal terminal OUT changes from the low level to the high level, the voltage of the first node Q1 may be further pulled up by the second capacitor C2, so that the second transistor T2 may be in the relatively full-on state, and lossless output of the scanning signal terminal OUT is ensured.

Figure 13:
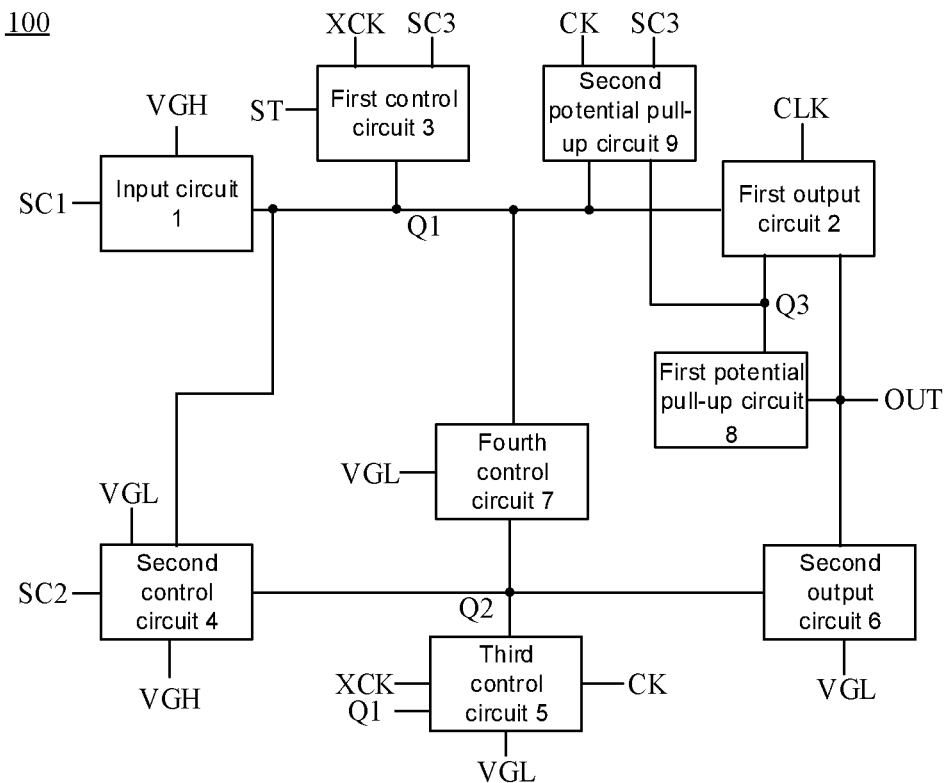
FIG. 13 is a structural diagram of yet another shift register, in accordance with some embodiments of the present disclosure.
Figure 14:
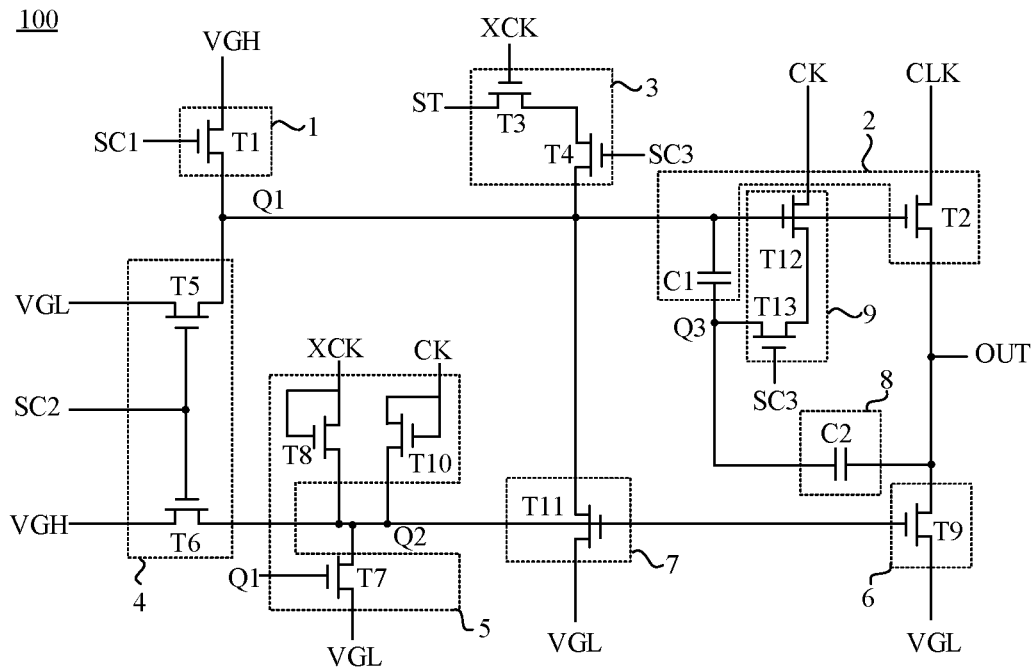
FIG. 14 is a circuit diagram of yet another shift register, in accordance with some embodiments of the present disclosure.

In some embodiments, as shown in FIGS. 13 and 14, the shift register 100 further includes: a second potential pull-up circuit 9.

In some examples, as shown in FIGS. 13 and 14, the second potential pull-up circuit 9 is electrically connected to the first node Q1, the fourth clock signal terminal SC3, the seventh clock signal terminal CK and the third node Q3. The second potential pull-up circuit 9 is configured to transmit the seventh clock signal received at the seventh clock signal terminal CK to the third node Q3 under control of both the voltage of the first node Q1 and the fourth clock signal, so as to pull up the voltage of the first node Q1 with the seventh clock signal.

For example, in a case where the voltage of the first node Q1 is at the high level and the level of the fourth clock signal is the high level, the second potential pull-up circuit 9 may be turned on under the control of both the voltage of the first node Q1 and the fourth clock signal, receive the seventh clock signal, and transmit the seventh clock signal to the third node Q3. In a case where the level of the seventh clock signal is the high level, the voltage of the first node Q1 may be pulled up due to a coupling bootstrap effect of the first capacitor C1 in the second output circuit 2.

It will be noted that, in a phase in which the second potential pull-up circuit 9 is turned on, the level of the third clock signal is also the high level. Therefore, in a process of the second potential pull-up circuit 9 being turned on, the voltage of the first node Q1 is firstly pulled up by the fifth clock signal transmitted by the first control circuit 3.

In these examples, types of the third transistor T3 and the fourth transistor T4 included in the first control circuit 3 are, for example, both metal oxide thin film transistors. Threshold voltages of the third transistor T3 and the fourth transistor T4 are both positive values. After the fifth clock signal is transmitted to the first node Q1 through the third transistor T3 and the fourth transistor T4, a voltage value of the fifth clock signal is easy to have a certain loss, which makes it difficult for the voltage of the first node Q1 to reach a relatively high voltage, thereby causing that the second transistor T2 in the first output circuit 2 is difficult to be completely turned on. Thus, after the scanning signal terminal OUT outputs the scanning signal, a voltage value of the scanning signal also has a certain loss.

By providing the second potential pull-up circuit 9, in a process that the first control circuit 3 is turned on to transmit the fifth clock signal to the first node Q1 to pull up the voltage of the first node Q1, the voltage of the first node Q1 may be further pulled up by the second potential pull-up circuit 9. In this way, the second transistor T2 in the first output circuit 2 may be in the relatively full-on state, thereby ensuring the lossless output of the scanning signal terminal OUT, and improving the accuracy of the scanning signal and the reliability of the shift register 100.

With reference to FIG. 14, a structure of the second potential pull-up circuit 9 is schematically described below.

In some examples, as shown in FIG. 14, the second potential pull-up circuit 9 includes a twelfth transistor T12 and a thirteenth transistor T13.

For example, a control electrode of the twelfth transistor T12 is electrically connected to the first node Q1, a first electrode of the twelfth transistor T12 is electrically connected to the seventh clock signal terminal CK, and a second electrode of the twelfth transistor T12 is electrically connected to a first electrode of the thirteenth transistor T13. A control electrode of the thirteenth transistor T13 is electrically connected to the fourth clock signal terminal SC3, and a second electrode of the thirteenth transistor T13 is electrically connected to the third node Q3.

For example, in a case where the voltage of the first node Q1 is at the high level, the twelfth transistor T12 may be turned on under the control of the voltage of the first node Q1, receive the seventh clock signal, and transmit the seventh clock signal to the first electrode of the thirteenth transistor T13. In a case where the level of the fourth clock signal is the high level, the thirteenth transistor T13 may be turned on under the control of the fourth clock signal, and transmit the seventh clock signal to the third node Q3. A voltage of the third node Q3 is determined according to the level of the seventh clock signal.

By providing the twelfth transistor T12 and the thirteenth transistor T13, the voltage of the third node Q3 may be pulled up due to a coupling bootstrap effect of the twelfth transistor T12 and the thirteenth transistor T13, and the voltage of the first node Q1 is pulled up due to the coupling bootstrap effect of the first capacitor C1.

Figure 15:
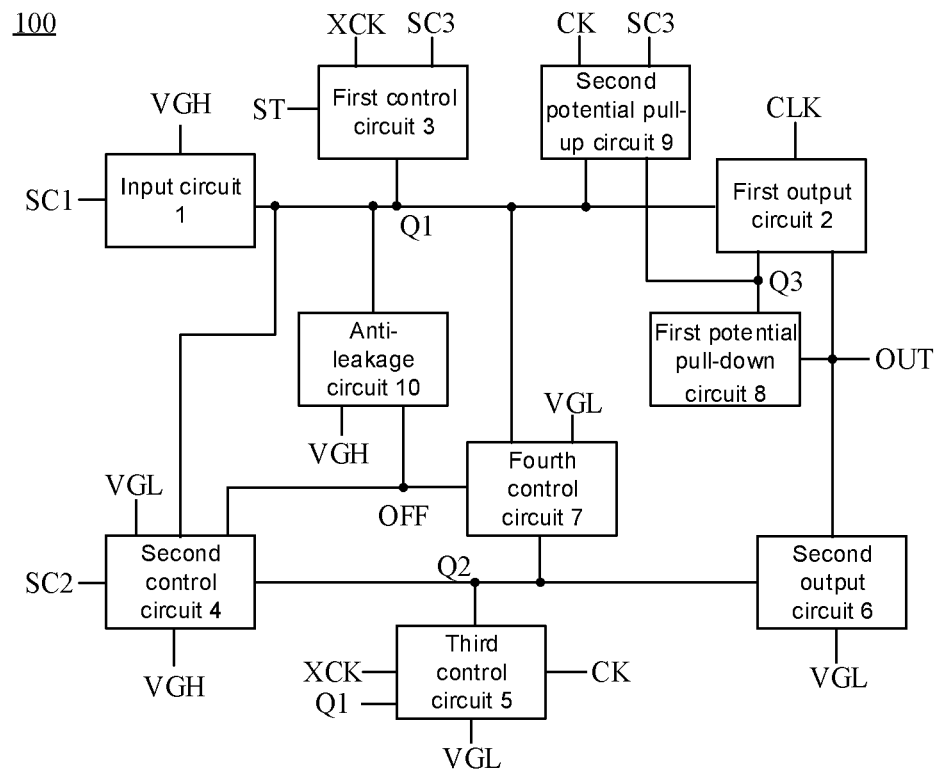
FIG. 15 is a structural diagram of yet another shift register, in accordance with some embodiments of the present disclosure.
Figure 16:
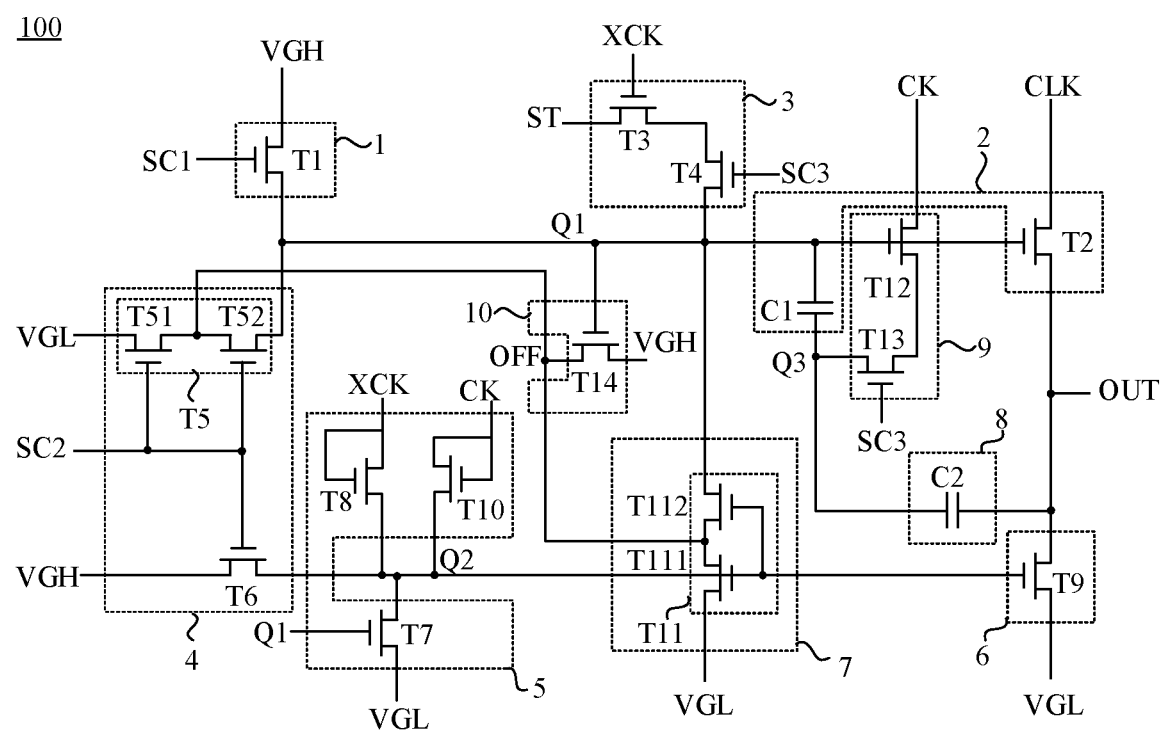
FIG. 16 is a circuit diagram of yet another shift register, in accordance with some embodiments of the present disclosure.

In some embodiments, as shown in FIGS. 15 and 16, the shift register 100 further includes an anti-leakage circuit 10.

In some examples, as shown in FIGS. 15 and 16, the anti-leakage circuit 10 is electrically connected to the first node Q1, the first voltage signal terminal VGH and an anti-leakage node OFF. The anti-leakage circuit 10 is configured to transmit the first voltage signal to the anti-leakage node OFF under the control of the voltage of the first node Q1.

For example, in a case where the voltage of the first node Q1 is at the high level, the anti-leakage circuit 10 may be turned on under the control of the voltage of the first node Q1, receive the first voltage signal, and transmit the first voltage signal to the anti-leakage node OFF.

Based on this, as shown FIGS. 15 and 16, the second control circuit 4 in the shift register 100 is further electrically connected to the anti-leakage node OFF. In this way, in the case where the voltage of the first node Q1 is at the high level, the anti-leakage circuit 10 may transmit the first voltage signal to the anti-leakage node OFF to pull up a voltage of the anti-leakage node OFF, so as to reduce a voltage difference between the anti-leakage node OFF and the first node Q1, thereby avoiding electric leakage of the first node Q1 through the second control circuit 4.

For example, as shown FIGS. 15 and 16, in a case where the shift register 100 further includes the fourth control circuit 7, the fourth control circuit 7 is further electrically connected to the anti-leakage node OFF. In this way, in the case where the voltage of the first node Q1 is at the high level, the anti-leakage circuit 10 may transmit the first voltage signal to the anti-leakage node OFF to pull up the voltage of the anti-leakage node OFF, so as to reduce the voltage difference between the anti-leakage node OFF and the first node Q1, thereby avoiding the electric leakage of the first node Q1 through the fourth control circuit 7.

With reference to FIG. 16, structures of the anti-leakage circuit 10, the second control circuit 4 and the fourth control circuit 7 are schematically described below.

In some examples, as shown in FIG. 16, the anti-leakage circuit 10 includes a fourteenth transistor T14.

For example, as shown in FIG. 16, a control electrode of the fourteenth transistor T14 is electrically connected to the first node Q1, a first electrode of the fourteenth transistor T14 is electrically connected to the first voltage signal terminal VGH, and a second electrode of the fourteenth transistor T14 is electrically connected to the anti-leakage node OFF.

For example, in the case where the voltage of the first node Q1 is at the high level, the fourteenth transistor T14 may be turned on under the control of the voltage of the first node Q1, receive the first voltage signal, and transmit the first voltage signal to the anti-leakage node OFF to charge the anti-leakage node OFF, so that the voltage of the anti-leakage node OFF is at a high level.

In some examples, as shown in FIG. 16, in a case where the second control circuit 4 includes the fifth transistor T5, the fifth transistor T5 includes a first sub-transistor T51 and a second sub-transistor T52.

For example, as shown in FIG. 16, a control electrode of the first sub-transistor T51 is electrically connected to the sixth clock signal terminal SC2, a first electrode of the first sub-transistor T51 is electrically connected to the second voltage signal terminal VGL, and a second electrode of the first sub-transistor T51 is electrically connected to the anti-leakage node OFF. A control electrode of the second sub-transistor T52 is electrically connected to the sixth clock signal terminal SC2, a first electrode of the second sub-transistor T52 is electrically connected to the anti-leakage node OFF, and a second electrode of the second sub-transistor T52 is electrically connected to the first node Q1.

For example, in the case where the level of the sixth clock signal is the high level, the first sub-transistor T51 and the second sub-transistor T52 may be simultaneously turned on under the control of the sixth clock signal, the first sub-transistor T51 may receive the second voltage signal and transmit the second voltage signal to the anti-leakage node OFF, and the second sub-transistor T52 may transmit the second voltage signal from the anti-leakage node OFF to the first node Q1, so that the voltage of the first node Q1 is pulled down to be at the low level.

In a case where the voltage of the first node Q1 is at the high level and the second control circuit 4 is in a non-working state, the anti-leakage circuit 10 may transmit the first voltage signal to the anti-leakage node OFF, so as to reduce the voltage difference between the anti-leakage node OFF and the first node Q1. A voltage difference between the control electrode and the second electrode of the first sub-transistor T51 may be less than zero. Thus, it is ensured that the first sub-transistor T51 is completely or relatively completely turned off. In this way, the electric leakage of the first node Q1 through the second control circuit 4 may be avoided, so that the first node Q1 may be maintained at a relatively high and relatively stable voltage.

In some examples, as shown in FIG. 16, in a case where the fourth control circuit 7 includes the eleventh transistor T11, the eleventh transistor T11 includes a third sub-transistor T111 and a fourth sub-transistor T112.

For example, as shown in FIG. 16, a control electrode of the third sub-transistor T111 is electrically connected to the second node Q2, a first electrode of the third sub-transistor T111 is electrically connected to the second voltage signal terminal VGL, and a second electrode of the third sub-transistor T111 is electrically connected to the anti-leakage node OFF. A control electrode of the fourth sub-transistor T112 is electrically connected to the second node Q2, a first electrode of the fourth sub-transistor T112 is electrically connected to the anti-leakage node OFF, and a second electrode of the fourth sub-transistor T112 is electrically connected to the first node Q1.

For example, in the case where the voltage of the second node Q2 is at the high level, the third sub-transistor T111 and the fourth sub-transistor T112 may be simultaneously turned on under the control of the voltage of the second node Q2, the third sub-transistor T111 may receive the second voltage signal and transmit the second voltage signal to the anti-leakage node OFF, and the fourth sub-transistor T112 may transmit the second voltage signal from the anti-leakage node OFF to the first node Q1, so that the voltage of the first node Q1 is pulled down to be at the low level.

In a case where the voltage of the first node Q1 is at the high level and the fourth control circuit 7 is in the non-working state, the anti-leakage circuit 10 may transmit the first voltage signal to the anti-leakage node OFF, so as to reduce the voltage difference between the anti-leakage node OFF and the first node Q1. A voltage difference between the control electrode and the second electrode of the third sub-transistor T111 may be less than zero. Thus, it is ensured that the third sub-transistor T111 is completely or relatively completely turned off. In this way, the electric leakage of the first node Q1 through the fourth control circuit 7 may be avoided, so that the first node Q1 may be maintained at the relatively high and relatively stable voltage.

In some embodiments, the scan driving circuit 1000 further includes a plurality of clock signal lines and a plurality of voltage signal lines.

Signal lines in the scan driving circuit 1000 are schematically described below by taking a structure of the scan driving circuit 1000 shown in FIG. 19 as an example.

As shown in FIG. 19, the scan driving circuit 1000 includes a first clock signal line CLK_1.

The first clock signal terminal SC1 of each shift register 100 is electrically connected to the first clock signal line CLK_1 to receive the first clock signal.

As shown in FIG. 19, the scan driving circuit 1000 includes a second clock signal line CLK_2.

The second clock signal terminal CLK of each shift register 100 is electrically connected to the second clock signal line CLK_2 to receive the second clock signal.

As shown in FIG. 19, the scan driving circuit 1000 includes a third clock signal line CLK_3.

A third clock signal terminal XCK of a (2N−1)th shift register 100 is electrically connected to the third clock signal line CLK_3 to receive the third clock signal. A seventh clock signal terminal CK of a (2N)th shift register 100 is electrically connected to the third clock signal line CLK_3 to receive the seventh clock signal.

As shown in FIG. 19, the scan driving circuit 1000 includes a fourth clock signal line CLK_4.

The fourth clock signal terminal SC3 of each shift register 100 is electrically connected to the fourth clock signal line CLK_4 to receive the fourth clock signal.

As shown in FIG. 19, the scan driving circuit 1000 includes a fifth clock signal line CLK_5.

A fifth clock signal terminal ST of a first shift register 100 is electrically connected to the fifth clock signal line CLK_5 to receive the fifth clock signal.

As shown in FIG. 19, a fifth clock signal terminal ST of any shift register 100 except the first shift register 100 is electrically connected to a scanning signal terminal OUT of a previous shift register 100.

As shown in FIG. 19, the scan driving circuit 1000 includes a sixth clock signal line CLK_6.

The sixth clock signal terminal SC2 of each shift register 100 is electrically connected to the sixth clock signal line CLK_6 to receive the sixth clock signal.

As shown in FIG. 19, the scan driving circuit 1000 includes a seventh clock signal line CLK_7.

A seventh clock signal terminal CK of the (2N−1)th shift register 100 is electrically connected to the seventh clock signal line CLK_7 to receive the seventh clock signal. A third clock signal terminal XCK of the (2N)th shift register 100 is electrically connected to the seventh clock signal line CLK_7 to receive the third clock signal.

As shown in FIG. 19, the scan driving circuit 1000 includes a first voltage signal line L1.

The first voltage signal terminal VGH of each shift register 100 is electrically connected to the first voltage signal line L1 to receive the first voltage signal.

As shown in FIG. 19, the scan driving circuit 1000 includes a second voltage signal line L2.

The second voltage signal terminal VGL of each shift register 100 is electrically connected to the second voltage signal line L2 to receive the second voltage signal.

It will be noted that a cascade relationship shown in FIG. 19 is only an example, and other cascade manners may also be used according to actual conditions.

A1, A2, A3, A4, AN−1 and AN shown in FIG. 19 respectively represent the first shift register 100, a second shift register 100, a third shift register 100, a fourth shift register 100, an (N−1)th shift register 100 and an Nth shift register 100. Here, N represents the number of rows, and N is a positive integer.

With reference to FIGS. 17 and 19, a method of driving the shift register 100 shown in FIG. 16 in the display phase of one frame is schematically described below.

For example, the method of driving the first shift register 100 (e.g., corresponding to the sub-pixels P in the first row in the display panel PNL) is described as follows. The method includes the first phase S1, the second phase S2, the third phase S3 and the fourth phase S4. The first phase S1 includes a period ① and a period ②, the second phase S2 includes a period ③, the third phase S3 includes a period ④ and a period ⑤, and the fourth phase S4 includes a period ⑥ and a period ⑦.

In the period ①, the level of the first clock signal is a high level, the level of the second clock signal is a low level, the level of the fourth clock signal is a low level, and the level of the sixth clock signal is a low level.

The first transistor T1 in the input circuit 1 is turned on under the control of the first clock signal, and transmits the first voltage signal to the first node Q1, so that the voltage of the first node Q1 is at a high level, and at the same time, the first capacitor C1 in the first output circuit 2 is charged.

The level of the fourth clock signal is the low level, and the first control circuit 3 is in the off state, thereby avoiding affecting the voltage of the first node Q1.

The seventh transistor T7 in the third control circuit 5 is turned on under the control of the voltage of the first node Q1, and transmits the second voltage signal to the second node Q2, so that the voltage of the second node Q2 is at a low level.

The level of the sixth clock signal is the low level, and the second control circuit 4 is in the state of being turned off, thereby avoiding affecting the voltage of the second node Q2.

The ninth transistor T9 in the second output circuit 6 is in the off state under the control of the voltage of the second node Q2.

The second transistor T2 in the first output circuit 2 is turned on under the control of the voltage of the first node Q1, and transmits the second clock signal to the scanning signal terminal OUT.

Since the level of the second clock signal is the low level, the level of the scanning signal is a low level in the phase ①.

In the phase ②, the level of the first clock signal is a low level, the level of the second clock signal is a high level, the level of the fourth clock signal is the low level, and the level of the sixth clock signal is the low level.

The first transistor T1 in the input circuit 1 is turned off under the control of the first clock signal.

The first capacitor C1 in the first output circuit 2 is discharged, so that the voltage of the first node Q1 is maintained at the high level, and the second transistor T2 is maintained in the on state.

In this phase, the level of the second clock signal changes from the low level to the high level, so that the voltage of the first node Q1 is continuously pulled up due to the coupling bootstrap effect of the second capacitor C2 in the first potential pull-up circuit 8. In this way, the second transistor T2 may be maintained in the relatively full-on state, thereby ensuring that the scanning signal terminal OUT may losslessly output a high-level scanning signal in the phase ②.

It will be noted that, in the phase ① and the phase ②, the fourteenth transistor T14 in the anti-leakage circuit 10 is in the on state under the control of the voltage of the first node Q1, and transmits the first voltage signal to the anti-leakage node OFF, thereby avoiding electric leakage of the first node Q1 through the fifth transistor T5 in the second control circuit 4 and the eleventh transistor T11 in the fourth control circuit 7.

In the phase ③, the level of the fourth clock signal is the low level, the level of the sixth clock signal is first a high level and then changes to the low level, and the level of the seventh clock signal is first a low level and then changes to a high level.

The fifth transistor T5 and the sixth transistor T6 in the second control circuit 4 are turned on under the control of the sixth clock signal. The fifth transistor T5 transmits the second voltage signal to the first node Q1, which makes the voltage of the first node Q1 at a low level, so that the second transistor T2 in the first output circuit 2 is turned off. The sixth transistor T6 transmits the first voltage signal to the second node Q2, so that the voltage of the second node Q2 is at a high level.

The eleventh transistor T11 in the fourth control circuit 7 is turned on under the control of the voltage of the second node Q2, and transmits the second voltage signal to the first node Q1 to continue to pull down the voltage of the first node Q1. Thus, the off state of the second transistor T2 may be further ensured.

The ninth transistor T9 in the second output circuit 6 is turned on under the control of the voltage of the second node Q2, and transmits the second voltage signal to the scanning signal terminal OUT.

In addition, when the level of the sixth clock signal changes from the high level to the low level, the level of the seventh clock signal changes from the low level to the high level. The tenth transistor T10 in the third control circuit 5 transmits the seventh clock signal to the second node Q2 to continue to charge the second node Q2, so that the voltage of the second node Q2 is maintained at the high level, and the ninth transistor T9 is maintained in the on state.

Since the level of the second voltage signal is the low level, the level of the scanning signal is the low level in the phase ③.

It will be seen from the above that, in the phase ① to the phase ③, the scanning signal output by the scanning signal terminal OUT corresponds to the reset phase and the compensation phase of the sub-pixel P. Durations of the reset phase and the compensation phase may be adjusted by adjusting the sixth clock signal.

In the phase ④, the level of the first clock signal is the low level, the level of the second clock signal is the high level, the level of the third clock signal is the high level, the level of the fourth clock signal is the high level, the level of the fifth clock signal is a high level, and the level of the sixth clock signal is the low level.

The first transistor T1 in the input circuit 1 is maintained in the off state under the control of the first clock signal.

In the first control circuit 3, the third transistor T3 is turned on under the control of the third clock signal, the fourth transistor T4 is turned on under the control of the fourth clock signal, and the third transistor T3 and the fourth transistor T4 transmit the fifth clock signal to the first node Q1. In this case, the first node Q1 may be charged by a high-level fifth clock signal, so that the voltage of the first node Q1 is at a high level; and the first capacitor C1 may also be charged simultaneously.

The seventh transistor T7 in the third control circuit 5 is turned on under the control of the voltage of the first node Q1, and transmits the second voltage signal to the second node Q2, so that the voltage of the second node Q2 is at the low level.

The level of the sixth clock signal is the low level, and the second control circuit 4 is in the off state, thereby avoiding affecting the voltage of the second node Q2.

The ninth transistor T9 in the second output circuit 6 is in the off state under the control of the voltage of the second node Q2.

The first capacitor C1 in the first output circuit 2 is discharged, so that the voltage of the first node Q1 is maintained at the high level, and the second transistor T2 is maintained in the on state.

Since the level of the second clock signal is the high level, in the phase ④, the level of the scanning signal is a high level.

In the phase ⑤, the level of the third clock signal is the low level, and the level of the seventh clock signal is the high level.

The third transistor T3 in the first control circuit 3 is turned off under the control of the third clock signal, so that the first control circuit 3 is turned off.

The first capacitor C1 in the first output circuit 2 is discharged, so that the voltage of the first node Q1 is maintained at the high level, and the second transistor T2 is maintained in the on state.

In the second potential pull-up circuit 9, the twelfth transistor T12 may be turned on under the control of the voltage of the first node Q1, the thirteenth transistor T13 may be turned on under the control of the fourth clock signal, and the twelfth transistor T12 and the thirteenth transistors T13 transmit the seventh clock signal to the third node Q3.

Since the level of the seventh clock signal changes to the high level, the first capacitor C1 may couple the voltage of the third node Q3 to the first node Q1, further pulling up the voltage of the first node Q1. In this way, the second transistor T2 may be kept in the relatively full-on state, thereby ensuring that the scanning signal terminal OUT may losslessly output a high-level scanning signal in the phase ⑤.

It will be noted that, in this phase, the scanning signal output by the scanning signal terminal OUT corresponds to the data writing phase of the sub-pixel P.

In the phase ⑥, the level of the third clock signal is the high level, the level of the fifth clock signal is the low level, and the level of the seventh clock signal is the low level.

The third transistor T3 and the fourth transistor T4 in the first control circuit 3 transmit the fifth clock signal to the first node Q1, so as to pull down the voltage of the first node Q1 to be at the low level.

The second transistor T2 in the first output circuit 2 is turned off under the control of the voltage of the first node Q1.

The eighth transistor T8 in the third control circuit 5 transmits the third clock signal to the second node Q2 under the control of the third clock signal, so as to charge the second node Q2. Thus, the voltage of the second node Q2 is at the high level.

The eleventh transistor T11 in the fourth control circuit 7 is turned on under the control of the voltage of the second node Q2, and transmits the second voltage signal to the first node Q1, thereby further pulling down the voltage of the first node Q1.

The ninth transistor T9 in the second output circuit 6 is turned on under the control of the voltage of the second node Q2, and transmits the second voltage signal to the scanning signal terminal OUT.

Since the level of the second voltage signal is the low level, the level of the scanning signal is the low level in the phase ⑥.

In the phase ⑦, the level of the third clock signal is the low level, and the level of the seventh clock signal is the high level.

The tenth transistor T10 in the third control circuit 5 transmits the seventh clock signal to the second node Q2 under the control of the seventh clock signal, so as to charge the second node Q2. Thus, the voltage of the second node Q2 is maintained at the high level.

The eleventh transistor T11 in the fourth control circuit 7 is turned on under the control of the voltage of the second node Q2, and transmits the second voltage signal to the first node Q1, thereby further pulling down the voltage of the first node Q1.

The ninth transistor T9 in the second output circuit 6 is turned on under the control of the voltage of the second node Q2, and transmits the second voltage signal to the scanning signal terminal OUT.

In this phase, the level of the third clock signal alternately changes between the low level and the high level, and the level of the seventh clock signal alternately changes between the high level and the low level, so as to ensure that the voltage of the first node Q1 is maintained at the low level and the voltage of the second node Q2 is maintained at the high level, thereby ensuring that the level of the scanning signal output by the scanning signal terminal OUT is maintained at the low level.

Figure 20:
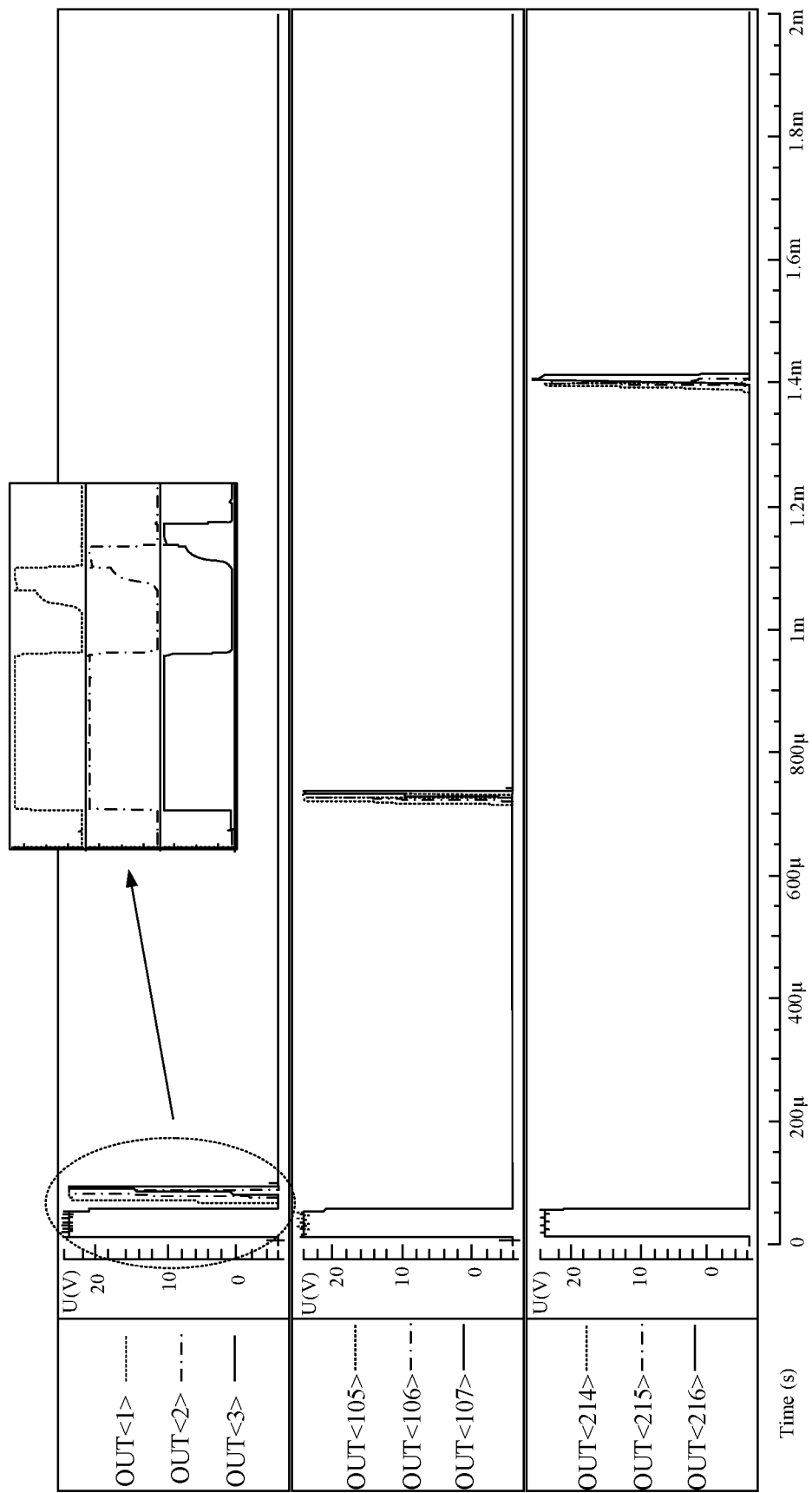
FIG. 20 is a simulation timing diagram of scanning signals output by the scan driving circuit in FIG. 19, in accordance with some embodiments of the present disclosure.

For example, FIG. 20 is a timing diagram showing a scanning signal output by a scanning signal terminal OUT<1> of the first shift register 100, a scanning signal output by a scanning signal terminal OUT<2> of the second shift register 100, a scanning signal output by a scanning signal terminal OUT<3> of the third shift register 100, a scanning signal output by a scanning signal terminal OUT<105> of a one hundred and fifth shift register 100, a scanning signal output by a scanning signal terminal OUT<106> of a one hundred and sixth shift register 100, a scanning signal output by a scanning signal terminal OUT<107> of a one hundred and seventh shift register 100, a scanning signal output by a scanning signal terminal OUT<214> of a two hundred and fourteenth shift register 100, a scanning signal output by a scanning signal terminal OUT<215> of a two hundred and fifteenth shift register 100 and a scanning signal output by a scanning signal terminal OUT<216> of a two hundred and sixteenth shift register 100 in the scan driving circuit 1000. It will be seen from FIG. 20 that the scanning signals substantially have no attenuation, and integrality of the scanning signals is relatively good.

In the embodiments of the present disclosure, processes of being turned on and being turned off of the transistors are all described by taking an example in which all transistors are the N-type transistors. In the embodiments of the present disclosure, the transistors may also be P-type transistors. In a case where all transistors are the P-type transistors, each control signal needs to be inverted.

The foregoing descriptions are merely specific implementations of the present disclosure, but the protection scope of the present disclosure is not limited thereto. Changes or replacements that any person skilled in the art could conceive of within the technical scope of the present disclosure shall be included in the protection scope of the present disclosure. Therefore, the protection scope of the present disclosure shall be subject to the protection scope of the claims.

What is claimed is:

1. A shift register, comprising:
    an input circuit electrically connected to a first clock signal terminal, a first voltage signal terminal and a first node, the input circuit being configured to transmit a first voltage signal received at the first voltage signal terminal to the first node under control of a first clock signal transmitted by the first clock signal terminal;
    a first output circuit electrically connected to the first node, a second clock signal terminal and a scanning signal terminal, the first output circuit being configured to transmit a second clock signal received at the second clock signal terminal to the scanning signal terminal under control of a voltage of the first node, so as to cause the scanning signal terminal to output a scanning signal;
    a first control circuit electrically connected to a third clock signal terminal, a fourth clock signal terminal, a fifth clock signal terminal and the first node, the first control circuit being configured to transmit a fifth clock signal received at the fifth clock signal terminal to the first node under control of both a third clock signal transmitted by the third clock signal terminal and a fourth clock signal transmitted by the fourth clock signal terminal, so as to control the voltage of the first node;
    a second control circuit electrically connected to a sixth clock signal terminal, a second voltage signal terminal, the first node, the first voltage signal terminal and a second node, the second control circuit being configured to, under control of a sixth clock signal transmitted by the sixth clock signal terminal, transmit a second voltage signal received at the second voltage signal terminal to the first node to control the voltage of the first node, and transmit the first voltage signal to the second node to control a voltage of the second node;
    a third control circuit electrically connected to the first node, the second voltage signal terminal, the third clock signal terminal and the second node, the third control circuit being configured to control the voltage of the second node under cooperation of the voltage of the first node and the third clock signal; and
    a second output circuit electrically connected to the second node, the second voltage signal terminal and the scanning signal terminal, the second output circuit being configured to transmit the second voltage signal to the scanning signal terminal under control of the voltage of the second node, so as to cause the scanning signal terminal to output the scanning signal.

2. The shift register according to claim 1, wherein the input circuit includes a first transistor;
    a control electrode of the first transistor is electrically connected to the first clock signal terminal, a first electrode of the first transistor is electrically connected to the first voltage signal terminal, and a second electrode of the first transistor is electrically connected to the first node.

3. The shift register according to claim 1, wherein the first output circuit includes a second transistor and a first capacitor;
    a control electrode of the second transistor is electrically connected to the first node, a first electrode of the second transistor is electrically connected to the second clock signal terminal, and a second electrode of the second transistor is electrically connected to the scanning signal terminal; and
    a first end of the first capacitor is electrically connected to the first node, and a second end of the first capacitor is electrically connected to the scanning signal terminal.

4. The shift register according to claim 1, wherein the first control circuit includes a third transistor and a fourth transistor;
    a control electrode of the third transistor is electrically connected to the third clock signal terminal, a first electrode of the third transistor is electrically connected to the fifth clock signal terminal, and a second electrode of the third transistor is electrically connected to a first electrode of the fourth transistor; and
    a control electrode of the fourth transistor is electrically connected to the fourth clock signal terminal, and a second electrode of the fourth transistor is electrically connected to the first node.

5. The shift register according to claim 1, wherein the second control circuit includes a fifth transistor and a sixth transistor;
    a control electrode of the fifth transistor is electrically connected to the sixth clock signal terminal, a first electrode of the fifth transistor is electrically connected to the second voltage signal terminal, and a second electrode of the fifth transistor is electrically connected to the first node; and
    a control electrode of the sixth transistor is electrically connected to the sixth clock signal terminal, a first electrode of the sixth transistor is electrically connected to the first voltage signal terminal, and a second electrode of the sixth transistor is electrically connected to the second node.

6. The shift register according to claim 1, wherein the third control circuit includes a seventh transistor and an eighth transistor;
  a control electrode of the seventh transistor is electrically connected to the first node, a first electrode of the seventh transistor is electrically connected to the second voltage signal terminal, and a second electrode of the seventh transistor is electrically connected to the second node; and
  a control electrode of the eighth transistor is electrically connected to the third clock signal terminal, a first electrode of the eighth transistor is electrically connected to the third clock signal terminal, and a second electrode of the eighth transistor is electrically connected to the second node;
  wherein a width-to-length ratio of the seventh transistor is greater than a width-to-length ratio of the eighth transistor.

7. The shift register according to claim 1, wherein the second output circuit includes a ninth transistor;
  a control electrode of the ninth transistor is electrically connected to the second node, a first electrode of the ninth transistor is electrically connected to the second voltage signal terminal, and a second electrode of the ninth transistor is electrically connected to the scanning signal terminal.

8. The shift register according to claim 1, wherein the third control circuit is further electrically connected to a seventh clock signal terminal;
  the third control circuit is further configured to control the voltage of second node under cooperation of a seventh clock signal transmitted by the seventh clock signal terminal, the voltage of the first node and the third clock signal;
  wherein the seventh clock signal and the third clock signal are inverted signals.

9. The shift register according to claim 8, wherein the third control circuit includes:
  a seventh transistor, wherein a control electrode of the seventh transistor is electrically connected to the first node, a first electrode of the seventh transistor is electrically connected to the second voltage signal terminal, and a second electrode of the seventh transistor is electrically connected to the second node; and
  a tenth transistor, wherein a control electrode of the tenth transistor is electrically connected to the seventh clock signal terminal, a first electrode of the tenth transistor is electrically connected to the seventh clock signal terminal, and a second electrode of the tenth transistor is electrically connected to the second node; and
  a width-to-length ratio of the seventh transistor is greater than a width-to-length ratio of the tenth transistor.

10. The shift register according to claim 1, further comprising:
  a fourth control circuit electrically connected to the second node, the second voltage signal terminal and the first node, and the fourth control circuit being configured to transmit the second voltage signal to the first node under the control of the voltage of the second node.

11. The shift register according to claim 10, wherein the fourth control circuit includes an eleventh transistor;
  a control electrode of the eleventh transistor is electrically connected to the second node, a first electrode of the eleventh transistor is electrically connected to the second voltage signal terminal, and a second electrode of the eleventh transistor is electrically connected to the first node.

12. The shift register according to claim 1, further comprising a first potential pull-up circuit, wherein
  the first potential pull-up circuit is electrically connected to the scanning signal terminal and a third node; the first output circuit is further electrically connected to the third node; and
  the first potential pull-up circuit is configured to pull up the voltage of the first node with the scanning signal in a phase in which the first output circuit causes the scanning signal terminal to output the scanning signal.

13. The shift register according to claim 12, wherein the first potential pull-up circuit includes a second capacitor, wherein
  a first end of the second capacitor is electrically connected to the scanning signal terminal, and a second end of the second capacitor is electrically connected to the third node; and
  the first output circuit includes a first capacitor, wherein a first end of the first capacitor is electrically connected to the first node, and a second end of the first capacitor is electrically connected to the scanning signal terminal through the second capacitor.

14. The shift register according to claim 12, further comprising a second potential pull-up circuit, wherein
  the second potential pull-up circuit is electrically connected to the first node, the fourth clock signal terminal, a seventh clock signal terminal and the third node; and
  the second potential pull-up circuit is configured to transmit a seventh clock signal received at the seventh clock signal terminal to the third node under control of both the voltage of the first node and the fourth clock signal, so as to pull up the voltage of the first node with the seventh clock signal.

15. The shift register according to claim 14, wherein the second potential pull-up circuit includes a twelfth transistor and a thirteenth transistor, wherein
  a control electrode of the twelfth transistor is electrically connected to the first node, a first electrode of the twelfth transistor is electrically connected to the seventh clock signal terminal, and a second electrode of the twelfth transistor is electrically connected to a first electrode of the thirteenth transistor; and
  a control electrode of the thirteenth transistor is electrically connected to the fourth clock signal terminal, and a second electrode of the thirteenth transistor is electrically connected to the third node.

16. The shift register according to claim 1, further comprising:
  an anti-leakage circuit electrically connected to the first node, the first voltage signal terminal and an anti-leakage node, and the anti-leakage circuit being configured to transmit the first voltage signal to the anti-leakage node under the control of the voltage of the first node; and
  a fourth control circuit electrically connected to the second node, the second voltage signal terminal and the first node, and the fourth control circuit being configured to transmit the second voltage signal to the first node under the control of the voltage of the second node;
  wherein the second control circuit is further electrically connected to the anti-leakage node; and
  the fourth control circuit is further electrically connected to the anti-leakage node.

17. The shift register according to claim 16, wherein the anti-leakage circuit includes:
- a fourteenth transistor, wherein a control electrode of the fourteenth transistor is electrically connected to the first node, a first electrode of the fourteenth transistor is electrically connected to the first voltage signal terminal, and a second electrode of the fourteenth transistor is electrically connected to the anti-leakage node;
- the second control circuit includes: —
- a fifth transistor, a control electrode of the fifth transistor being electrically connected to the sixth clock signal terminal, a first electrode of the fifth transistor being electrically connected to the second voltage signal terminal, and a second electrode of the fifth transistor being electrically connected to the first node; wherein the fifth transistor includes:
  - a first sub-transistor, wherein a control electrode of the first sub-transistor is electrically connected to the sixth clock signal terminal, a first electrode of the first sub-transistor is electrically connected to the second voltage signal terminal, and a second electrode of the first sub-transistor is electrically connected to the anti-leakage node; and
  - a second sub-transistor, wherein a control electrode of the second sub-transistor is electrically connected to the sixth clock signal terminal, a first electrode of the second sub-transistor is electrically connected to the anti-leakage node, and a second electrode of the second sub-transistor is electrically connected to the first node;
- the fourth control circuit includes: —
- an eleventh transistor, a control electrode of the eleventh transistor being electrically connected to the second node, a first electrode of the eleventh transistor being electrically connected to the second voltage signal terminal, and a second electrode of the eleventh transistor being electrically connected to the first node; wherein—
  the eleventh transistor includes and;
  - a third sub-transistor, wherein a control electrode of the third sub-transistor is electrically connected to the second node, a first electrode of the third sub-transistor is electrically connected to the second voltage signal terminal, and a second electrode of the third sub-transistor is electrically connected to the anti-leakage node; and
  - a fourth sub-transistor, wherein a control electrode of the fourth sub-transistor is electrically connected to the second node, a first electrode of the fourth sub-transistor is electrically connected to the anti-leakage node, and a second electrode of the fourth sub-transistor is electrically connected to the first node.

18. A method of driving the shift register according to claim 1, the method comprising:
- in a first phase, in response to the first clock signal received at the first clock signal terminal, the input circuit being turned on, and transmitting the first voltage signal received at the first voltage signal terminal to the first node;
- under the control of the voltage of the first node, the first output circuit being turned on, and transmitting the second clock signal received at the second clock signal terminal to the scanning signal terminal, so as to cause the scanning signal terminal to output the scanning signal;
- transmitting, by the third control circuit, the second voltage signal received at the second voltage signal terminal to the second node to control the voltage of the second node, under the control of the voltage of the first node; and
- under the control of the voltage of the second node, the second output circuit being turned off;
- in a second phase, in response to the sixth clock signal received at the sixth clock signal terminal, the second control circuit being turned on, transmitting the second voltage signal to the first node to control the voltage of the first node, and transmitting the first voltage signal to the second node to control the voltage of the second node;
- under the control of the voltage of the first node, the first output circuit being turned off; and
- under the control of the voltage of the second node, the second output circuit being turned on, and transmitting the second voltage signal to the scanning signal terminal, so as to cause the scanning signal terminal to output the scanning signal;
- in a third phase, transmitting, by the first control circuit, the fifth clock signal received at the fifth clock signal terminal to the first node to control the voltage of the first node, in response to the third clock signal received at the third clock signal terminal and the fourth clock signal received at the fourth clock signal terminal;
- under the control of the voltage of the first node, the first output circuit being turned on, and transmitting the second clock signal to the scanning signal terminal, so as to causes the scanning signal terminal to output the scanning signal;
- transmitting, by the third control circuit, the second voltage signal to the second node to control the voltage of the second node, under the control of the voltage of the first node; and
- under the control of the voltage of the second node, the second output circuit being turned off;
- in a fourth phase, transmitting, by the first control circuit, the fifth clock signal to the first node to control the voltage of the first node, in response to the third clock signal and the fourth clock signal;
- under the control of the voltage of the first node, the first output circuit being turned off;
- transmitting, by the third control circuit, the third clock signal to the second node to control the voltage of the second node, in response to the third clock signal; and
- under the control of the voltage of the second node, the second output circuit being turned on, and transmitting the second voltage signal to the scanning signal terminal, so as to cause the scanning signal terminal to output the scanning signal.

19. A scan driving circuit, comprising a plurality of shift registers that are connected in cascade according to claim 1.

20. A display apparatus, comprising the scan driving circuit according to claim 19.

* * * * *